United States Patent
Sato et al.

(10) Patent No.: US 11,545,525 B2
(45) Date of Patent: Jan. 3, 2023

(54) IMAGING DEVICE

(71) Applicant: PANASONIC INTELLECTUAL PROPERTY MANAGEMENT CO., LTD., Osaka (JP)

(72) Inventors: Yoshihiro Sato, Osaka (JP); Satoshi Shibata, Osaka (JP); Ryota Sakaida, Toyama (JP)

(73) Assignee: PANASONIC INTFLLECTUAL PROPERTY MANAGEMENT CO., LTD., Osaka (JP)

( * ) Notice: Subject to any disclaimer, the term of this patent is extended or adjusted under 35 U.S.C. 154(b) by 97 days.

(21) Appl. No.: 17/013,289

(22) Filed: Sep. 4, 2020

(65) Prior Publication Data

US 2021/0074768 A1 Mar. 11, 2021

Related U.S. Application Data

(60) Provisional application No. 62/896,503, filed on Sep. 5, 2019.

(51) Int. Cl.
*H01L 27/146* (2006.01)
*H01L 27/30* (2006.01)
*H01L 51/42* (2006.01)

(52) U.S. Cl.
CPC ........ *H01L 27/307* (2013.01); *H01L 51/4253* (2013.01)

(58) Field of Classification Search
CPC ............. H01L 25/167; H01L 27/14643; H01L 27/3227; H01L 31/02024; H01L 31/0203;
(Continued)

(56) References Cited

U.S. PATENT DOCUMENTS 7,713,809 B2 5/2010 Rhodes et al.
9,443,912 B2 9/2016 Hatano et al.
(Continued)

FOREIGN PATENT DOCUMENTS

CN 1556546 A * 12/2004
JP 2004055903 A * 2/2004
(Continued)

OTHER PUBLICATIONS

Sueoka, K., et al. "Systematic Investigation of Gettering Effects on 4th Row Element Impurities in Si by Dopant Atoms," Research Article, Hindawi Publishing Corporation, Advances in Materials Science and Engineering; vol. 2009, Article ID 309209, 3 pages; doi: 10.1155/2009/309209.
(Continued)

*Primary Examiner* — Samuel Park
(74) *Attorney, Agent, or Firm* — McDermott Will & Emery LLP

(57) ABSTRACT

An exemplary imaging device according to the present disclosure includes: an imaging region including a plurality of pixels; a peripheral region located outside of the imaging region; and a blockade region located between the imaging region and the peripheral region Each of the plurality of pixels includes a photoelectric conversion layer, a pixel electrode to collect a charge generated in the photoelectric conversion layer, and a first doped region electrically connected to the pixel electrode. In the peripheral region, a circuit to drive the plurality of pixels is provided. The blockade region includes a second doped region of a first conductivity type located between the imaging region and the peripheral region and a plurality of first contact plugs connected to the second doped region.

20 Claims, 11 Drawing Sheets

(58) Field of Classification Search
CPC .......... H01L 31/0284; H01L 31/1032; H01L 31/107; H01L 27/307; H01L 51/4253; H01L 27/14603; H01L 27/14636; H01L 27/14683; H01L 27/14609; H01L 27/14689; H01L 27/1463; Y02E 10/549
See application file for complete search history.

(56) References Cited

U.S. PATENT DOCUMENTS

| 9,478,585 | B2 | 10/2016 | Hatano et al. | |
|---|---|---|---|---|
| 2004/0232494 | A1 | 11/2004 | Nagano et al. | |
| 2007/0029590 | A1 | 2/2007 | Rhodes et al. | |
| 2008/0265295 | A1* | 10/2008 | Brady | H01L 27/14689 257/E31.085 |
| 2014/0043510 | A1 | 2/2014 | Kasuga et al. | |
| 2014/0246706 | A1* | 9/2014 | Mori | H01L 27/14609 257/222 |
| 2015/0041781 | A1 | 2/2015 | Hatano et al. | |
| 2015/0109503 | A1 | 4/2015 | Mori et al. | |
| 2016/0268220 | A1* | 9/2016 | Tsai | H01L 27/14627 |
| 2020/0176490 | A1* | 6/2020 | Ikeda | H01L 27/1461 |

FOREIGN PATENT DOCUMENTS

| JP | 2009071173 | A | * | 4/2009 |
|---|---|---|---|---|
| JP | 4470734 | B2 | | 6/2010 |
| JP | 2013-123000 | A | | 6/2013 |
| JP | 2018224279 | A | * | 11/2018 |
| JP | 2019-029399 | A | | 2/2019 |
| WO | 2012/147302 | A1 | | 11/2012 |
| WO | 2014/002330 | A1 | | 1/2014 |

OTHER PUBLICATIONS

Kurita, K. et al., "Gettering Technology for CMOS Image Sensors Using a Cluster Ion Implantation," Surface Science vol. 37, No. 3, pp. 104-109, 2016; with English translation.

Yamaguchi, T. et al., "White Spots Reduction by Ultimate Proximity Metal Gettering at Carbon Complexes Formed underneath Contact Area in CMOS Image Sensors," 2016, IEEE; 2016 Symposium on VLSI Technology Digest of Technical Papers, 2 pages.

* cited by examiner

IMAGING DEVICE

CROSS REFERENCE TO RELATED APPLICATION

This application claims the benefit of U.S. Provisional Patent Application No. 62/896,503 filed Sep. 5, 2019, which is incorporated in its entirety herein by reference.

BACKGROUND

1. Technical Field

The present disclosure relates to an imaging device.

2. Description of the Related Art

Semiconductor imaging devices such as CMOS image sensors are in wide use. A semiconductor imaging device includes a semiconductor substrate on which a plurality of pixels are formed. As is described in Japanese Patent Publication No. 2019-029399 and the specification of U.S. Published Patent Application No. 2007/0029590 below, generally speaking, the semiconductor substrate of a semiconductor imaging device has an imaging region that includes an array of a plurality of pixels and a peripheral region that is located outside of the imaging region. In the peripheral region, circuitry for driving the pixels is formed.

Each pixel of a semiconductor imaging device has a charge storage region to temporarily retain a signal charge that is obtained through photoelectric conversion. This charge storage region includes a doped region (formed in the semiconductor substrate) in a portion thereof. A signal charge that is stored in a pixel is read out by a source follower or other readout circuit, in the form of an analog signal which is in accordance with the amount of stored charge. Therefore, if a charge which is different from a signal charge representing an image flows into the charge storage region, the SN ratio will decrease and the resultant image will be degraded. Such an unintended flow of charge into the charge storage region may also be referred to as a dark current.

One known cause of dark current is a transfer of charge between the imaging region, which includes pixels that undergo analog operations and the peripheral region, which includes circuitry that operate on the basis of digital signals. Japanese Patent Publication No. 2019-029399 and the specification of U.S. Published Patent Application No. 2007/0029590 below disclose configurations in which an n-type sidewall structure is formed on a p-type substrate. An n-type sidewall structure surrounds the pixel array, and functions to electrically isolate the pixel array from the circuitry that is formed in the peripheral region.

SUMMARY

In the field of imaging devices, there is a demand for noise reduction. According to a non-limiting and illustrative embodiment of the present disclosure, the following is provided.

An imaging device comprising: an imaging region including a plurality of pixels, each pixel including a photoelectric conversion layer, a pixel electrode to collect a charge generated in the photoelectric conversion layer, and a first doped region electrically connected to the pixel electrode; a peripheral region located outside of the imaging region, with a circuit to drive the plurality of pixels being provided in the peripheral region; and a blockade region including: a second doped region of a first conductivity type located between the imaging region and the peripheral region; and a plurality of first contact plugs connected to the second doped region.

General or specific implementations may be realized in the form of elements, devices, modules, systems, or methods. Moreover, general or specific implementations may be realized by any arbitrary combination of an element, a device, an apparatus, a module, a system, and/or a method. Additional effects and advantages of the embodiments disclosed herein will become apparent from the specification and the drawings. Effects and/or advantages are individually provided by various embodiments or features disclosed in the specification and the drawings; not all of them are required to obtain one or more of these.

According an embodiment of the present disclosure, there is provided an imaging device in which a decrease in the SN ratio associated with a dark current or the like is suppressed.

DETAILED DESCRIPTION

Figure 1:
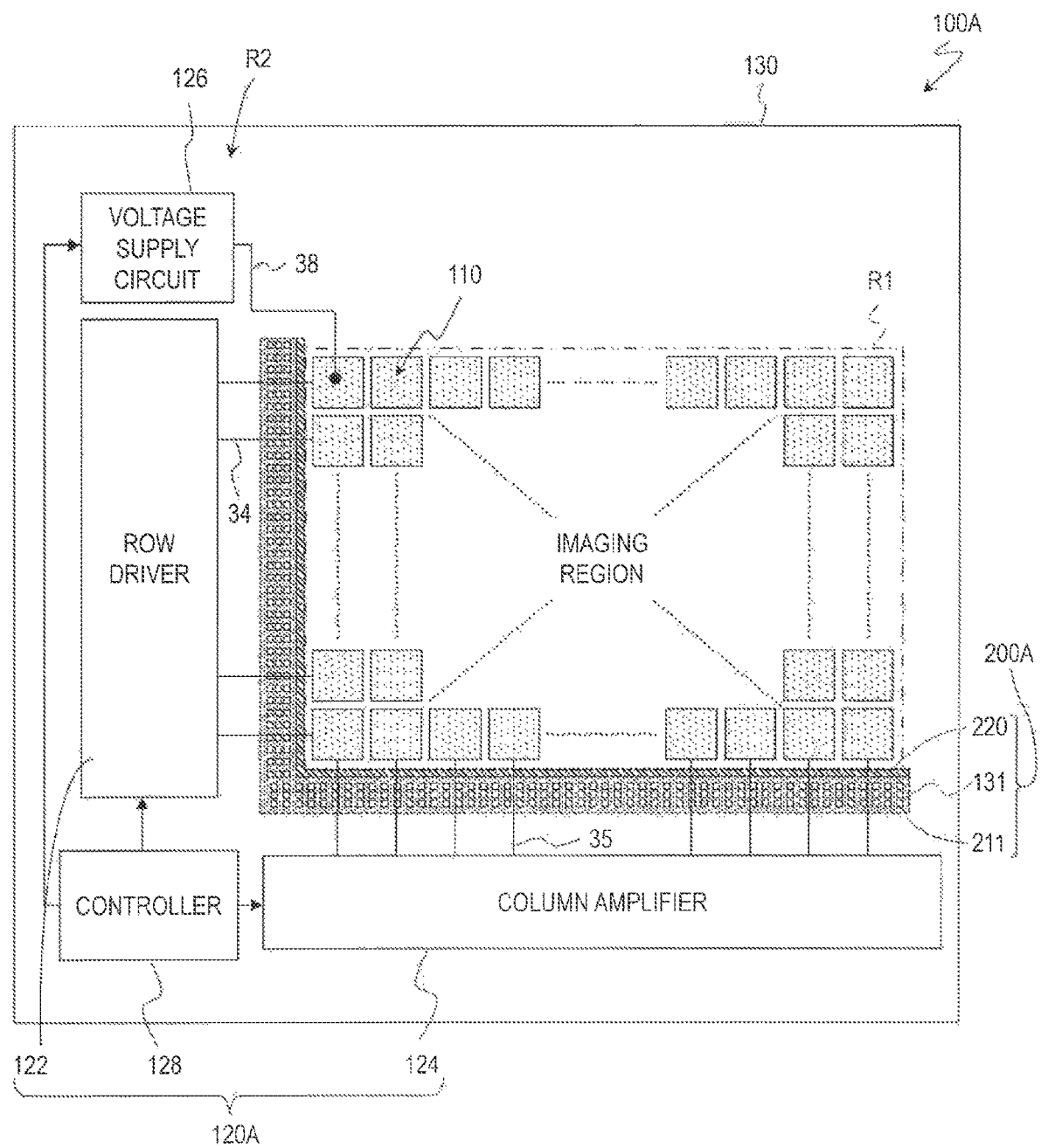
FIG. 1 is a diagram schematically showing an example configuration of an imaging device according to an embodiment of the present disclosure.

In outline, implementations of the present disclosure may be as follows.

[Item 1]

An imaging device comprising:

an imaging region including a plurality of pixels, each pixel including a photoelectric conversion layer, a pixel electrode to collect a charge generated in the photoelectric conversion layer, and a first doped region electrically connected to the pixel electrode;

a peripheral region located outside of the imaging region, with a circuit to drive the plurality of pixels being provided in the peripheral region; and a blockade region including: a second doped region of a first conductivity type located between the imaging region and the peripheral region; and a plurality of first contact plugs connected to the second doped region.

With the configuration of Item 1, since a blockade region including a second doped region and a plurality of first contact plugs connected to the second doped region is disposed between an imaging region including a plurality of pixels and a peripheral region outside the imaging region, it is possible to discharge, via the blockade region, any excess charge occurring inside a semiconductor substrate in which the first doped regions are formed, for example. Thus, electrostatic coupling between the first doped region in a pixel to temporarily retain a signal charge and the peripheral circuitry can be suppressed, whereby a dark current can be advantageously suppressed where any signal line, etc., supplying a digital clock signal serves as a noise source.

[Item 2]

The imaging device of Item 1, wherein, the blockade region includes:

a third doped region of a second conductivity type located between the peripheral region and the second doped region; and a plurality of second contact plugs provided in the third doped region.

[Item 3]

The imaging device of Item 2, wherein the third doped region surrounds the imaging region in an annular shape in plan view.

[Item 4]

The imaging device of Item 2 or 3, wherein, the blockade region includes:

a fourth doped region of the first conductivity type located between the peripheral region and the third doped region; and a plurality of third contact plugs provided in the fourth doped region.

With the configuration of Item 4, electrical coupling between a circuit formed in the imaging region and the peripheral circuitry, via a semiconductor substrate, can be more effectively suppressed.

[Item 5]

The imaging device of any of Items 2 to 4, further comprising a semiconductor substrate having the first doped regions, the second doped region, and the third doped region, wherein, the semiconductor substrate further includes, inside the semiconductor substrate, an impurity layer of the second conductivity type that is located in a position deeper than the first doped regions; and the third doped region includes two portions each extending, in a cross section perpendicular to a surface of the semiconductor substrate, from the surface and reaching the impurity layer.

With the configuration of Item 5, the plurality of second contact plugs are allowed to function as well contacts, thus making it possible to control the potential of the impurity layer of the second conductivity type via the plurality of second contact plugs. Moreover, transfers of excess charge into the plurality of first doped regions functioning as charge storage regions of the pixels can be more effectively suppressed.

[Item 6]

The imaging device of Item 5, wherein the semiconductor substrate further includes a plurality of fifth doped regions of the first conductivity type extending through the impurity layer.

With the configuration of Item 6, it is possible to establish an electrical connection, via the fifth doped regions, between structures that are spaced apart by the impurity layer.

[Item 7]

The imaging device of Item 6, wherein the plurality of fifth doped regions include one or more doped regions located below the plurality of first contact plugs, the one or more doped regions being connected at one end to the second doped region.

With the configuration of Item 7, it becomes possible to control the potentials of wells in which the plurality of first doped regions are formed, by utilizing an electrical path including the second doped region of the blockade region and the plurality of fifth doped regions in the semiconductor substrate.

[Item 8]

The imaging device of any of Items 5 to 7, wherein the blockade region includes a first carbon-containing layer located between the plurality of first contact plugs and the second doped region.

With the configuration of Item 8, by utilizing gettering of nickel with carbon, in particular, diffusion of nickel from a silicide layer in the blockade region into the imaging region can be suppressed.

[Item 9]

The imaging device of Item 8, wherein the blockade region includes an isolation located between the imaging region and the plurality of first contact plugs in plan view.

[Item 10]

The imaging device of Item 9, wherein a peak in carbon concentration along a depth direction of the semiconductor substrate in the first carbon-containing layer appears at a position shallower than a lower end of the isolation.

With the configuration of Item 10, the range over which nickel is diffused from the silicide layer disposed in the blockade region can be minimized.

[Item 11]

The imaging device of any of Items 8 to 10, wherein the blockade region includes a first silicide layer located between the plurality of first contact plugs and the first carbon-containing layer.

With the configuration of Item 11, contact resistance between the plurality of first contact plugs and the second doped region is reduced.

[Item 12]

The imaging device of Item 11, wherein the first silicide layer comprises nickel.

With the configuration of Item 12, a silicide showing lower resistivity can be formed.

[Item 13]

The imaging device of any of claims 5 to 12, wherein, each pixel includes an electrically conductive portion that includes in a portion thereof a fifth contact plug electrically connected to the first doped region;

the electrically conductive portion includes a second silicide layer; and the pixel electrode is electrically connected to the first doped region via the electrically conductive portion.

[Item 14]

The imaging device of claim 13, wherein the electrically conductive portion includes a second carbon-containing layer located between the second silicide layer and the first doped region.

With the configuration of Item 14, even when the fifth contact plug contains a silicide, diffusion of nickel or the like into the first doped region, via the fifth contact plug, can be suppressed by the second carbon-containing layer.

[Item 15]

The imaging device of Item 13 or 14, wherein the semiconductor substrate in each pixel includes a third carbon-containing layer located between the first doped region and the fifth contact plug.

With the configuration of Item 15, even when the fifth contact plug contains a silicide, diffusion of nickel or the like into the first doped region, via the fifth contact plug, can be suppressed by the third carbon-containing layer.

[Item 16]

The imaging device of any of Items 1 to 15, wherein the second doped region surrounds the imaging region in an annular shape in plan view.

With the configuration of Item 16, a charge transfer between the charge storage region of a pixel and a circuit formed in the peripheral region can be suppressed more effectively.

[Item 17]

The imaging device of any of Items 1 to 16, wherein the first conductivity type is P-type.

With the configuration of Item 17, the gettering effect can be exhibited for many metals in the second doped region of the blockade region, whereby an effect of suppressing diffusion of a metal impurity into the charge storage regions of the pixels, and hence suppressing degradation of image quality associated with diffusion of the metal impurity, can be expected.

[Item 18]

An imaging device having a plurality of pixels, the imaging device comprising:

a semiconductor substrate in which a plurality of doped regions are provided;

a photoelectric conversion layer supported by the semiconductor substrate; and a plurality of pixel electrodes located between the semiconductor substrate and the photoelectric conversion layer, wherein, each pixel includes:

a portion of the photoelectric conversion layer;

one of the plurality of pixel electrodes;

one of the plurality of doped regions; and a contact plug electrically connected to the one of the plurality of doped regions; and the semiconductor substrate includes a carbon-containing layer located between the doped regions and the contact plugs.

With the configuration of Item 18, even when the contact plugs contain a silicide, diffusion of nickel or the like into the doped region via the contact plugs can be suppressed by the carbon-containing layer.

[Item 19]

The imaging device of Item 18, wherein the pixel electrode of each pixel is electrically connected to the doped region via the contact plug.

Hereinafter, with reference to the drawings, embodiments of the present disclosure will be described in detail. Embodiments to be described below are general or specific examples. In the following embodiments, numerical values, shapes, materials, constituent elements, arrangement of and interconnections between constituent elements, steps, order of steps, etc., are only exemplary, and are not intended to limit the present disclosure. Various implementations that are described in the present specification are capable of being combined unless it is impossible to do so. Among the constituent elements in the following embodiments, those constituent elements which are not recited in the most generic independent claims will be explained as arbitrary constituent elements.

In the following description, constituent elements having substantially an identical function may be denoted with an identical reference numeral, with their description being omitted. Moreover, in order to prevent the drawings from becoming excessively complicated, some elements may be omitted from illustration. Regarding various elements of any imaging device, their dimensions, appearance, etc., as appearing in the drawings may differ from the dimensions and appearance of an actual imaging device. In other words, each attached drawing is only a schematic diagram for the understanding of the present disclosure, without having to strictly represent the scale, etc., with respect to the actual imaging device.

(Embodiments of Imaging Devices)

FIG. 1 schematically shows an example configuration of an imaging device according to an embodiment of the present disclosure. An imaging device 100A shown in FIG. 1 includes a plurality of pixels 110 arranged in a plurality of rows and columns. In the configuration illustrated in FIG. 1, the pixels 110 are arranged in m rows and n columns to form an imaging region R1 of a generally rectangular shape. Herein, m and n each independently represent an integer which is one or greater.

As will be described later, in an embodiment of the present disclosure, each of these pixels 110 includes: a photoelectric conversion structure that is supported by a semiconductor substrate 130; and a readout circuit that is formed on the semiconductor substrate 130 so as to be electrically connected to the photoelectric conversion structure. In other words, hereinafter, an imaging device of a so-called "stacked type" will be taken as an example in illustrating the embodiment of the present disclosure. As will be specifically described later with reference to the drawings, each of the plurality of pixels 110 includes a doped region which is provided on the semiconductor substrate 130, the doped region functioning as part of a charge storage region to temporarily retain a signal charge that is generated by the photoelectric conversion structure.

The imaging device 100A further includes peripheral circuitry 120A to drive the plurality of pixels 110. In the example shown in FIG. 1, the peripheral circuitry 120A includes a row driver 122, a column amplifier 124, a voltage supply circuit 126, and a controller 128. In an embodiment of the present disclosure, all or some of these circuits are formed on the semiconductor substrate 130, as are the readout circuits for the respective pixels. As schematically shown in FIG. 1, the peripheral circuitry 120A is located in a peripheral region R2 of the semiconductor substrate 130, which is located outside of the imaging region R1 including the plurality of pixels 110.

The imaging device 100A, further includes a blockade region 200A which is provided between the imaging region R1 and the peripheral region R2. As schematically shown in FIG. 1, the blockade region 200A includes a doped region 131 which is formed on the semiconductor substrate 130 and a plurality of contact plugs 211 which are provided on the doped region 131. The doped region 131 is typically a p-type diffusion region.

Since the plurality of contact plugs 211 are formed on the doped region 131, they are electrically connected to the doped region 131 of the semiconductor substrate 130. As will be described later, the plurality of contact plugs 211 are connected to a power source not shown in FIG. 1, thus being configured so as to be able to supply a predetermined voltage to the doped region 131. In other words, during the operation of the imaging device 100A, the doped region 131 has a predetermined voltage applied thereto via the contact plugs 211.

Moreover, the blockade region 200A includes an isolation 220. The isolation 220 is a structure which is formed on the semiconductor substrate 130 via a shallow trench isolation process (STI process), for example. The isolation 220 at least includes a portion of the semiconductor substrate 130 lying between those of the plurality of pixels 110 which are located outmost in the imaging region R1 and digital circuitry (such as the row driver 122) that operates based on a digital clock signal. Herein, the isolation 220 is located between some pixels 110 which are located outmost in the imaging region R1 and the row driver 122, and between some pixels 110 which are located outmost in the imaging region R1 and the column amplifier 124. As will be described later, the isolation 220 may be provided on the semiconductor substrate 130 so as to surround the imaging region R1 as viewed from above.

In a configuration where peripheral circuitry including a circuit to operate on the basis of a digital clock signal is formed on a semiconductor substrate having a doped region to temporarily retain a signal charge that is obtained through photoelectric conversion, the circuit to operate on the basis of a digital clock signal may become a noise source that generates noise at each rise and fall of an input pulse. More specifically, the voltage in a signal line which supplies a digital clock signal to a CMOS logic circuit or other digital circuitry fluctuates with the digital clock signal. The voltage fluctuations on the signal line associated with the digital clock signal cause fluctuations in the substrate potential, whereby excess charge may be generated in wells that are inside the semiconductor substrate. When excess charge that is caused by fluctuations in the substrate potential flows into the doped region in a pixel retaining a signal charge, the SN ratio will decrease and the resultant image will be degraded.

On the other hand, in the imaging device 100A shown in FIG. 1, the blockade region 200A, which includes the doped region 131 being configured so as to be capable of connecting to a power source (e.g., ground) by means of the plurality of contact plugs 211, is disposed between the imaging region R1 including the plurality of pixels 110 and the digital circuitry. During the operation of the imaging device 100A, the potential of the doped region 131 of the blockade region 200A can be fixed by connecting a predetermined voltage source to the plurality of contact plugs 211. For example, the potential of the doped region 131 of the blockade region 200A can be equated to ground via the plurality of contact plugs 211. At this time, the blockade region 200A functions as a low impedance path for discharging the excess charge occurring inside the semiconductor substrate 130. In other words, this can suppress electrostatic coupling between the doped region in the pixel to retain a signal charge and the peripheral circuitry 120A, whereby a dark current can be advantageously suppressed where any signal line supplying a digital clock signal serves as a noise source.

Now, details of each circuit composing the peripheral circuitry 120A will be described. The row driver 122 has a connection with a plurality of address signal lines 34. The address signal lines 34 are provided correspondingly to the respective rows in the plurality of pixels 110. Each address signal line 34 is connected to one or more pixels belonging to the corresponding row. With the application of a row selection signal to the address signal line 34, the row driver 122 controls the timing of reading signals from the pixels 110 to vertical signal lines 35 (described later). The row driver 122 is also called a row scanning circuit. Note that the signal lines to be connected to the row driver 122 are not limited to the address signal lines 34. To the row driver 122, a plurality of types of signal lines may be connected to each row of pixels 110.

As schematically shown in FIG. 1, the imaging device 100A also includes a plurality of vertical signal lines 35. A vertical signal line 35 is provided for each column in the plurality of pixels 110. Each vertical signal line 35 is connected to one or more pixels belonging to the corresponding column. The vertical signal lines 35 are connected to the column amplifier 124. The column amplifier 124 sequentially outputs signals having been read from the pixels 110, to output lines not shown in FIG. 1. The column amplifier 124 is also called a column scanning circuit.

The controller 128 receives command data, clock pulses, etc., which may be supplied from outside of the imaging device 100A to control the entire imaging device 100A. The controller 128 typically includes a timing generator, and supplies driving signals to the row driver 122, the column amplifier 124, a voltage supply circuit 126 to be described later, and so on. In FIG. 1, arrows extending from the controller 128 schematically represent flows of output signals from the controller 128. The controller 128 may be implemented by a microcontroller including one or more processors, for example. The functions of the controller 128 may be realized by a combination of a general-purpose processing circuit and software, or implemented in hardware which is specialized for such processing.

In an embodiment of the present disclosure, the peripheral circuitry 120A includes a voltage supply circuit 126 that is electrically connected to each pixel 110 in the imaging region R1. The voltage supply circuit 126 supplies a predetermined voltage to each pixel 110 via the voltage line 38. Without being limited to any particular power circuit, the voltage supply circuit 126 may be a circuit that converts a voltage supplied from a power source such as a battery into a predetermined voltage, or a circuit that generates a predetermined voltage. The voltage supply circuit 126 may be a part of the aforementioned row driver 122. As schematically shown in FIG. 1, these circuits constituting the peripheral circuitry 120A is disposed in the peripheral region R2 outside of the imaging region R1.

The number and arrangement of pixels 110 are not limited to the illustrated example. For example, the number of pixels 110 included in the imaging device 100A may be one. In this example, the centers of the pixels 110 are located on lattice points of a square lattice; however, for example, the plurality of pixels 110 may be disposed so that the centers of the pixels 110 are located on lattice points of a triangular lattice, a hexagonal lattice, or the like. For example, the pixels 110 may be arranged in a linear array, in which case the imaging device 100A may be utilized as a line sensor.

Figure 2:
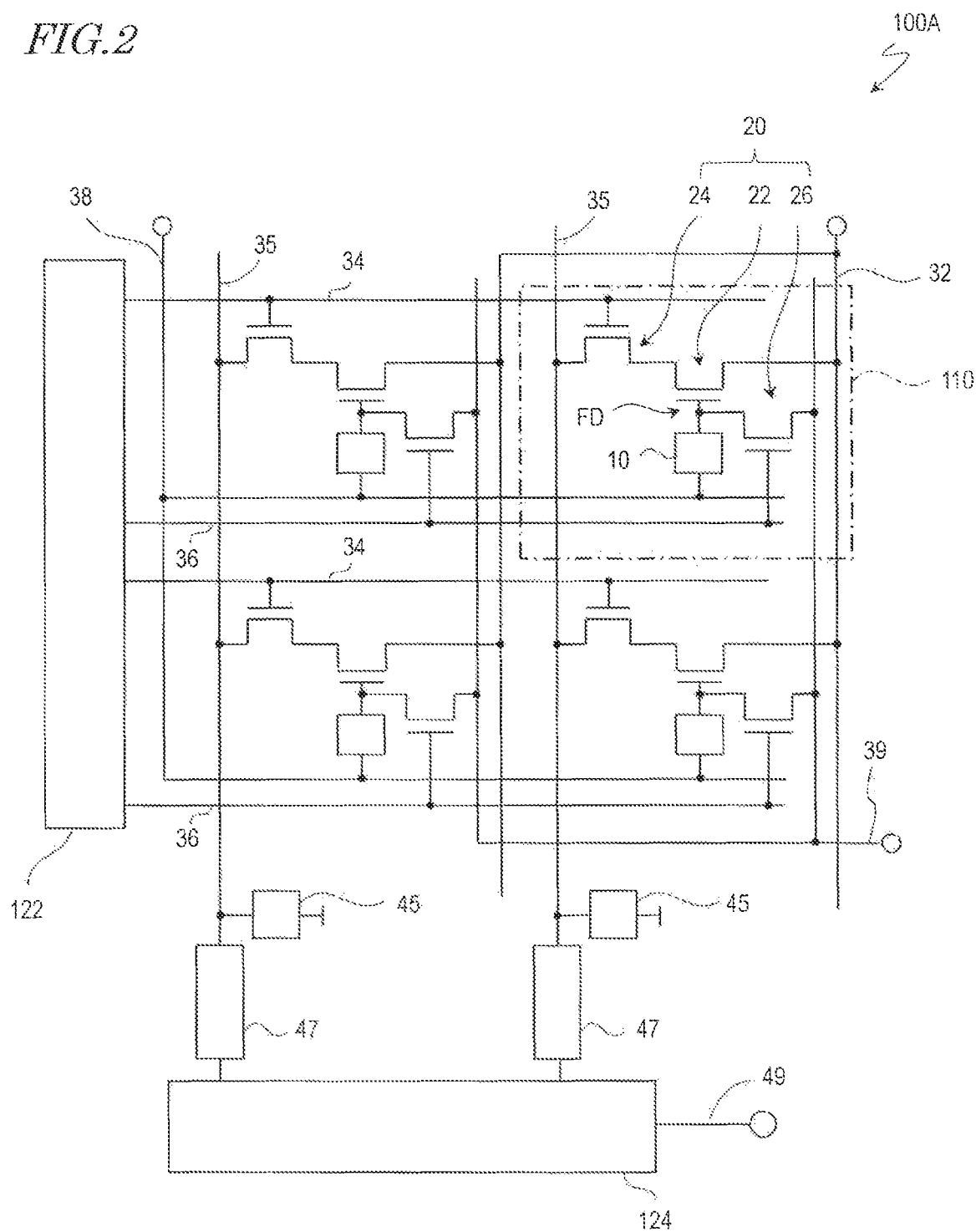
FIG. 2 is a diagram schematically showing an illustrative circuit configuration for the imaging device 100A shown in FIG. 1.

FIG. 2 schematically shows an illustrative circuit configuration for the imaging device 100A shown in FIG. 1. In FIG. 2, in order to prevent the drawings from becoming excessively complicated, among the plurality of pixels 110, only four pixels 110 constituting an array of 2 rows and 2 columns are singled out. Each of these pixels 110 includes a photoelectric conversion structure 10 that is supported by the semiconductor substrate 130 and a readout circuit 20 that is electrically connected to the photoelectric conversion structure 10. As will be specifically described later with reference to the drawings, the photoelectric conversion structure 10 includes a photoelectric conversion layer disposed above the semiconductor substrate 130.

The photoelectric conversion structure 10 in each pixel 110 includes a connection with the voltage line 38 that is connected to the voltage supply circuit 126, thus being configured so as to be capable of applying a predetermined voltage via the voltage line 38 during the operation of the imaging device 100A. For example, out of positive and negative charges that are generated through photoelectric conversion, when the positive charge is to be utilized as the signal charge, a positive voltage of about 10 V may be applied to the voltage line 38 during the operation of the imaging device 100A, for example. Hereinafter, a case will be exemplified where holes are utilized as signal charges.

In the configuration illustrated in FIG. 2, the readout circuit 20 includes a signal detection transistor 22, an address transistor 24, and a reset transistor 26. The signal detection transistor 22, the address transistor 24, and the reset transistor 26 typically are field-effect transistors formed on the semiconductor substrate 130. Hereinafter, unless otherwise indicated, an example where N-channel MOSFETs are used as the transistors will be described.

As shown schematically in FIG. 2, a gate of the signal detection transistor 22 is electrically connected to the photoelectric conversion structure 10. During the operation, by applying a predetermined voltage from the voltage supply circuit 126 to the photoelectric conversion structure 10 of each pixel 110 via the voltage line 38, a hole, for example, can be stored in the charge storage node FD as the signal charge. Herein, the charge storage node FD is a node that connects the gate of the signal detection transistor 22 to the photoelectric conversion structure 10. The charge storage node FD functions to temporarily retain the charge that is generated by the photoelectric conversion structure 10. As will be described later with reference to the drawings, the charge storage node FD includes in a portion thereof a doped region formed in the semiconductor substrate 130.

As shown n FIG. 2, a drain of the signal detection transistor 22 of each pixel 110 is connected to a power source line 32. The power source line 32 supplies a power source voltage VDD of about 3.3 V to the signal detection transistor 22 during the operation of the imaging device 100A, for example. On the other hand, a source of the signal detection transistor 22 is connected to the vertical signal line 35 via the address transistor 24. With the power source voltage VDD being supplied to its drain, the signal detection transistor 22 outputs a signal voltage that is in accordance with the amount of signal charge stored in the charge storage node FD.

To a gate of the address transistor 24 being connected between the signal detection transistor 22 and the vertical signal line 35, the address signal line 34 is connected With the application of a row selection signal to the address signal line 34, the row driver 122 controls ON and OFF of the address transistor 24. In other words, under the control of the row selection signal, the row driver 122 is able to read the output of the signal detection transistor 22 of a selected pixel 110 to the corresponding vertical signal line 35. Note that the location of the address transistor 24 is not limited to the example shown in FIG. 2, and it may be between the drain of the signal detection transistor 22 and the power source line 32.

To each of the vertical signal lines 35, a load circuit 45 and a column signal processing circuit 47 are connected Together with the signal detection transistor 22, the load circuit 45 constitutes a source follower circuit. The column signal processing circuit 47 performs noise reduction signal processing, such as correlated double sampling, as well as analog-digital conversion, etc. The column signal processing circuit 47 is also called a row signal storage circuit. The column amplifier 124 sequentially reads signals from the plurality of column signal processing circuits 47 to a horizontal common signal line 49. The column signal processing circuit 47 may be a part of the column amplifier 124. The load circuit 45 and the column signal processing circuit 47 may each be a part of the aforementioned peripheral circuitry 120A.

In this example, the readout circuit 20 includes not only the signal detection transistor 22 and the address transistor 24 but also the reset transistor 26. One of the drain and source of the reset transistor 26 is connected to the charge storage node FD, while the other of the drain and the source is connected to a reset voltage line 39. The reset voltage line 39 includes a connection with a reset voltage supply circuit not shown in FIG. 2, whereby it is able to supply a predetermined reset voltage $V_{ref}$ to the reset transistor 26 of each pixel 110 during the operation of the imaging device 100A. As the reset voltage $V_{ref}$, 0 V or a voltage near 0 V is chosen, for example. Similarly to the aforementioned voltage supply circuit 126, the reset voltage supply circuit may at least be capable of applying the predetermined reset voltage $V_{ref}$ to the reset voltage line 39, while its specific configuration is not limited to any particular power circuit. The reset voltage supply circuit may be a part of the row driver 122. The voltage supply circuit 126 and the reset voltage supply circuit may be independent and separate circuits, or may be disposed on the imaging device 100A in the form of a single voltage supply circuit. The reset voltage supply circuit may also be a part of the aforementioned peripheral circuitry 120A.

To a gate of the reset transistor 26, a reset signal line 36 is connected. Similarly to the address signal lines 34, each reset signal line 36 is provided correspondingly to a row in the plurality of pixels 110, and is connected to the row driver 122 herein. As described earlier, with the application of a row selection signal to the address signal line 34, the row driver 122 is able to select the pixels 110 from which to read signals in a row-by-row manner. Similarly, by applying a reset signal to the gates of the reset transistors 26 via the reset signal line 36, the row driver 122 is able to turn ON the reset transistors 26 in the selected row. As the reset transistor 26 is turned. ON, the potential of the charge storage node FD is reset.

(Pixel and Blockade Region)

Figure 3:
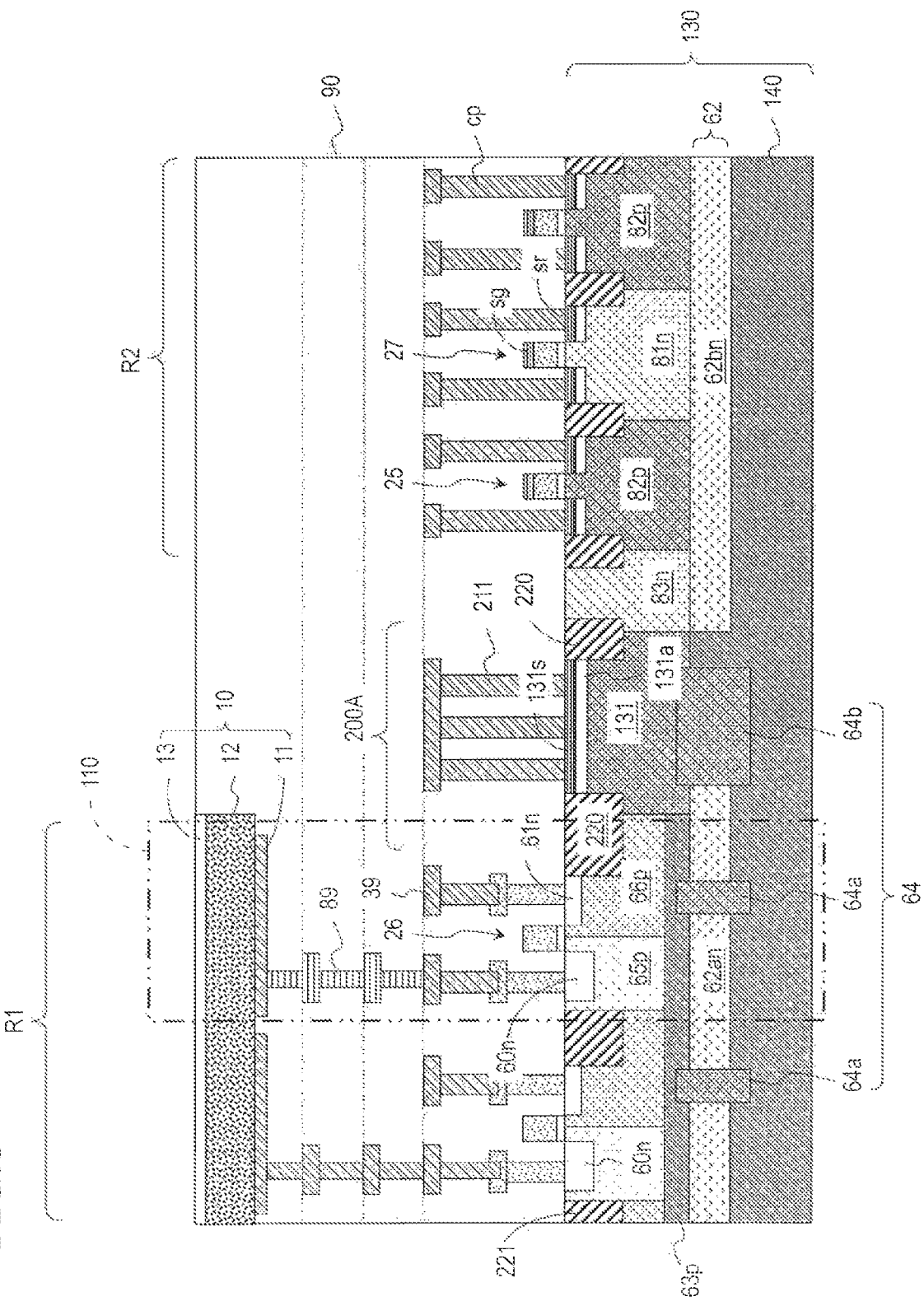
FIG. 3 is a schematic cross-sectional view showing an imaging region R1 and a peripheral region R2, and a blockade region 200A located therebetween.

FIG. 3 schematically shows a cross section containing the imaging region R1 and peripheral region R2 and the blockade region 200A. Herein, a cross section of two pixels that are located near the blockade region 200A is shown, these being representative of the plurality of pixels 110.

First, the imaging region R1 will be discussed. In the imaging region R1, a photoelectric conversion layer 12 is provided. The photoelectric conversion layer 12 is supported by the semiconductor substrate 130. On the photoelectric conversion layer 12, a light-transmitting counter electrode 13 is disposed. As shown in FIG. 3, each of the photoelectric conversion layer 12 and the counter electrode 13 is typically provided so as to be continuous above the semiconductor substrate 130 across the plurality of pixels 110.

The pixel 110 is a unit structure composing the imaging region R1, including a photoelectric conversion structure 10 that possesses a portion of the photoelectric conversion layer 12 and a portion of the counter electrode 13 and the pixel electrode 11. The pixel electrode 11 of the photoelectric conversion structure 10 is located between the photoelectric conversion layer 12 and the semiconductor substrate 130, and is made of a metal such as aluminum or copper, a metal nitride, a polysilicon which is rendered electrically conductive by being doped with an impurity, or the like. As schematically shown in FIG. 3, the pixel electrode 11 of each pixel 110 is electrically isolated from the pixel electrode 11 of another adjacent pixel, with spatial-separation from pixel to pixel.

The photoelectric conversion layer 12 of the photoelectric conversion structure 10 is made of an organic material or an inorganic material such as amorphous silicon. The photoelectric conversion layer 12 receives light which is incident, via the counter electrode 13, and generates positive and negative charges through photoelectric conversion. In other words, the photoelectric conversion structure 10 functions to convert light into charge. The photoelectric conversion layer 12 may include a layer which is made of an organic material and a layer which is made of an inorganic material.

The counter electrode 13 of the photoelectric conversion structure 10 is an electrode which is made of a transparent electrically conductive material such as ITO. In the specification, the term "light-transmitting" refers to an ability to transmit at least a portion of light of wavelengths that the photoelectric conversion layer 12 is capable of absorbing, and it is not required that light be transmitted across the entire wavelength range of visible light. Although omitted from illustration in FIG. 3, the counter electrode 13 has a connection with the aforementioned voltage line 38. During the operation of the imaging device 100A, the voltage in the voltage line 38 may be controlled so that the potential of the counter electrode 13 is higher than the potential of the pixel electrode 11, for example, whereby the positive charge, between the positive and negative charges that are generated through photoelectric conversion, can be selectively collected with the pixel electrode 11. By forming the counter electrode 13 in the form of a single continuous layer across the plurality of pixels 110, it becomes possible to universally apply a predetermined potential to the counter electrodes 13 of the plurality of pixels 110 via the voltage line 38.

Each of the plurality of pixels 110 further includes a portion of the semiconductor substrate 130. As schematically shown in FIG. 3, the semiconductor substrate 130 includes a plurality of doped regions 60n as first doped regions, near its surface. Each doped region 60n functions as one of a drain region and a source region of the reset transistor 26 included in the aforementioned readout circuit 20. Moreover, the semiconductor substrate 130 also includes doped regions 61n each of which is the other one of the drain region and the source region of the reset transistor 26. As schematically shown in FIG. 3, each doped region 61n is connected to the reset voltage line 39 via a polysilicon plug or the like. Herein, the doped regions 60n and the doped regions 61n have an n-type conductivity. The plurality of doped regions 60n and 61n are typically n-type diffusion regions.

As will be understood from this, on the semiconductor substrate 130, a plurality of readout circuits 20 are formed correspondingly to the plurality of pixels 110. The readout circuit 20 of each pixel is electrically isolated from the readout circuits 20 of the other pixels by the isolation 221 provided on the semiconductor substrate 130.

As shown in FIG. 3, between the photoelectric conversion structure 10 and the semiconductor substrate 130, an interlayer insulating layer 90 covering the semiconductor substrate 130 is located. The interlayer insulating layer 90 generally includes a plurality of insulating layers and a plurality of layers of interconnection lines. The plurality of interconnection layers disposed in the interlayer insulating layer 90 may include: an interconnection layer including the address signal lines 34 and the reset signal lines 36, etc., in portions thereof; an interconnection layer including the vertical signal lines 35, the power source lines 32 and the reset voltage lines 39, etc., in portions thereof; and the like. The number of insulating layers and the number of interconnection layers in the interlayer insulating layer 90 are not limited to this example, and may be set arbitrarily.

Inside the interlayer insulating layer 90, an electrically conducting structure 89 is provided which electrically connects the pixel electrode 11 of the photoelectric conversion structure 10 in each pixel to the readout circuit 20 formed on the semiconductor substrate 130. As schematically shown in FIG. 3, the electrically conducting structure 89 includes interconnection lines and vias disposed in the interlayer insulating layer 90. Such interconnection lines and vias are typically made of a metal such as copper or tungsten, or a metal compound such as a metal nitride or a metal oxide. The electrically conducting structure 89 also includes a contact plug connected to the aforementioned doped region 60n. The contact plug connected to the doped region 60n is typically a polysilicon plug, which is doped with an impurity such as phosphorus in order to enhance electrical conductivity. Although omitted from illustration in FIG. 3, the electrically conducting structure 89 also has an electrical connection with the gate electrode of the signal detection transistor 22.

The semiconductor substrate 130 will be discussed. The semiconductor substrate 130 includes a support substrate 140 and one or more semiconductor layers formed on the support substrate 140. In the example shown in FIG. 3, the semiconductor substrate 130 includes an n-type impurity layer 62 provided on the support substrate 140. Hereinafter, a p-type silicon substrate will be exemplified as the support substrate 140. The support substrate 140 may have a lower electrical resistivity than that of the impurity layer 62. Note that the semiconductor substrate 130 may be a silicon-on-insulator substrate (SOI substrate) or a substrate having a semiconductor layer provided on its surface via epitaxial growth, etc., or the like.

In the configuration illustrated in FIG. 3, the imaging region R1 will be discussed first. The semiconductor substrate 130 includes an n-type semiconductor layer 62an on the support substrate 140 and a p-type semiconductor layer 63p on the n-type semiconductor layer 62an. The n-type semiconductor layer 62an located between the support substrate 140 and the p-type semiconductor layer 63p is a portion of the aforementioned impurity layer 62. During the operation of the imaging device 100A, the potential of the impurity layer 62 is controlled via a well contact not shown in FIG. 3. Providing the impurity layer inside the semiconductor substrate 130 (the impurity layer 62 including in a portion thereof the n-type semiconductor layer 62an located in the imaging region R1) allows minority carriers to be restrained from flowing into the charge storage region storing the signal charge from the support substrate 140 or the peripheral circuitry.

In the configuration illustrated in FIG. 3, the semiconductor substrate 130 further includes a p-type semiconductor layer 66p located above the p-type semiconductor layer 63p and a p-type doped region 65p formed in the p-type semiconductor layer 66p. In this example, the aforementioned doped region 60n having a connection with the electrically conducting structure 89 is provided in the p-type doped region 65p. A junction capacitance that as created by the pn junction between the doped region 60n and the p-type doped region 65p, serving as a p well, functions as a capacitance to store at least a portion of the signal charge that is collected by the pixel electrode 11. In other words, the doped region 60n constitutes at least a portion of the charge storage region to temporarily retain the signal charge. On the other hand, the doped region 61n is provided in the p-type semiconductor layer 66p. Herein, the impurity concentration in the p-type doped region 65p is lower than the impurity concentration in the p-type semiconductor layer 66p.

Moreover, the semiconductor substrate 130 includes a plurality of p-type regions 64 which are provided in the semiconductor substrate 130 so as to extend through the impurity layer 62. The p-type regions 64 have a relatively high impurity concentration. Providing the p-type regions 64 inside the semiconductor substrate 130 makes it possible to electrically connect two regions of a common conductivity type which are spaced apart by the impurity layer 62.

Herein, the plurality of p-type regions 64 include: a plurality of p-type regions 64a located in the imaging region R1 when viewed from the normal direction of the semiconductor substrate 130; and one or more p-type regions 64b located below the plurality of contact plugs 211 in the blockade region 200A. The p-type regions 64a are formed between the p-type semiconductor layer 63p and the support substrate 140 so as to extend through the n-type semiconductor layer 62an, and function to electrically connect the p-type semiconductor layer 63p and the support substrate 140. On the other hand, the p-type region (s) 64b is electrically connected to the doped region 131 because one end thereof reaches the doped region 131 of the blockade region 200A, thus electrically connecting the doped region 131 and the support substrate 140.

Therefore, herein, an electrical path is created in the semiconductor substrate 130 which extends from the doped region 131 of the blockade region 200A to the p-type semiconductor layer 63p via the p-type region (s) 64b, the support substrate 140, and the p-type regions 64a. As described above, the plurality of contact plugs 211 are connected to the doped region 131 of the blockade region 200A, the contact plugs 211 being configured so as to be capable of connecting to a power source not shown (e.g., ground). For example, the potential of the doped region 131 of the blockade region 200A can be equated to ground via the plurality of contact plugs 211. By connecting an appropriate power source to the plurality of contact plugs 211 in the blockade region 200A, it is possible to control the potentials of the p-type doped region 65p and the p-type semiconductor layer 66p via the p-type semiconductor layer 63p, by utilizing the electrical path including the doped region 131 the p-type region(s) 64b, the support substrate 140, and the p-type regions 64a.

In the example shown in FIG. 3, a doped region 131a whose impurity concentration is made comparatively high is formed in a portion of the doped region 131 that is located near the surface of the semiconductor substrate 130. The contact plugs 211 are typically made of a metal. Providing the doped region 131a having a comparatively high impurity concentration within the doped region 131, and connecting the plurality of contact plugs 211 to the doped region 131a, confers an effect of reducing the contact resistance between the plurality of contact plugs 211 and the doped region 131.

Furthermore, in this example, a silicide layer 131s is provided between the plurality of contact plugs 211 and the doped region 131. Providing the silicide layer 131s in the surface vicinity of the semiconductor substrate 130 within the doped region 131a and connecting the plurality of contact plugs 211 allows to further reduce contact resistance.

Next, the peripheral region R2 of the semiconductor substrate 130 will be discussed. As mentioned above, in the peripheral region R2, a circuit for driving the plurality of pixels 110 and a circuit for processing signals that are read from the plurality of pixels 110 are formed. The peripheral region R2 includes, for example, a plurality of transistors 25 and 27 that compose a logic circuit such as a multiplexer. As schematically shown in FIG. 3, herein, an n-type semiconductor layer 62bn which is another portion of the impurity layer 62, is formed on the support substrate 140, whereas an n-type doped region 81n and a p-type doped region 82p, serving as wells, are formed on the n-type semiconductor layer 62bn. The drain region and the source region of each transistor 25 are located in the p-type doped region 82p, and the drain region and the source region of each transistor 27 are located in the re-type doped region 81n. Note that the n-type semiconductor layer 62bn is isolated from the n-type semiconductor layer 62an around the entire periphery of the imaging region R1, because of a portion of the support substrate 140 being present there. The n-type semiconductor layer 62bn is connected to a power source (not shown), whereby a predetermined voltage is supplied to the n-type semiconductor layer 62bn.

In the configuration illustrated in FIG. 3, a silicide layer sr is also formed above the drain region and the source region of each peripheral transistor such as the transistors 25 and 27 located in the peripheral region R2. As shown in the figure, contact plugs cp are connected to the drain region and the source region of each peripheral transistor. Forming the silicide layer sr in the peripheral transistors and connecting the contact plugs cp thereto provides an effect of reducing contact resistance. Further herein, a silicide layer sg is also formed above the gate electrode of each peripheral transistor. Forming the silicide layer sg allows to reduce contact resistance between contact plugs (not shown) connected to the gate electrode or between the interconnection line and the gate electrode. Thus, the places in which to provide the silicide layers are not limited to the blockade region 200A.

Figure 4:
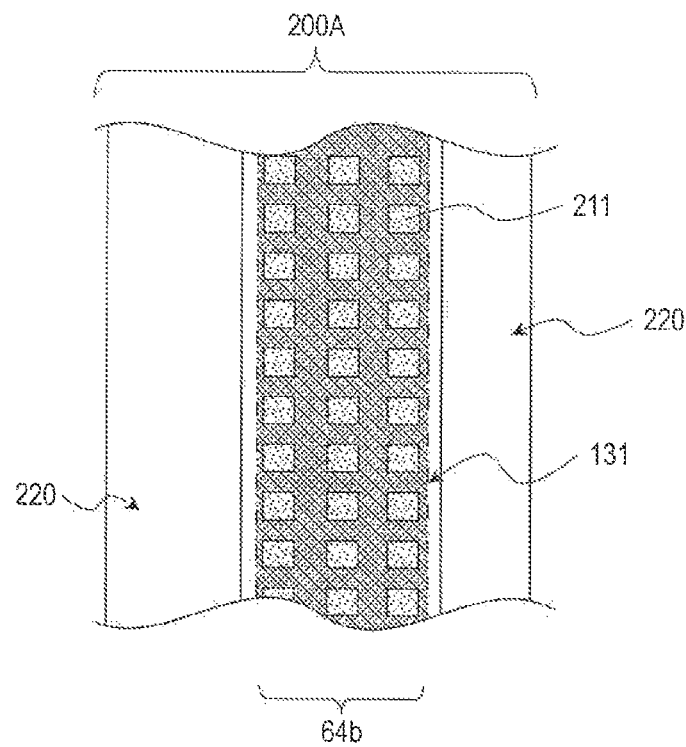
FIG. 4 is a schematic plan view showing an example appearance of the blockade region 200A as viewed from the normal direction of a semiconductor substrate 130, for describing an example arrangement of a p-type region(s) 64b.
Figure 5:
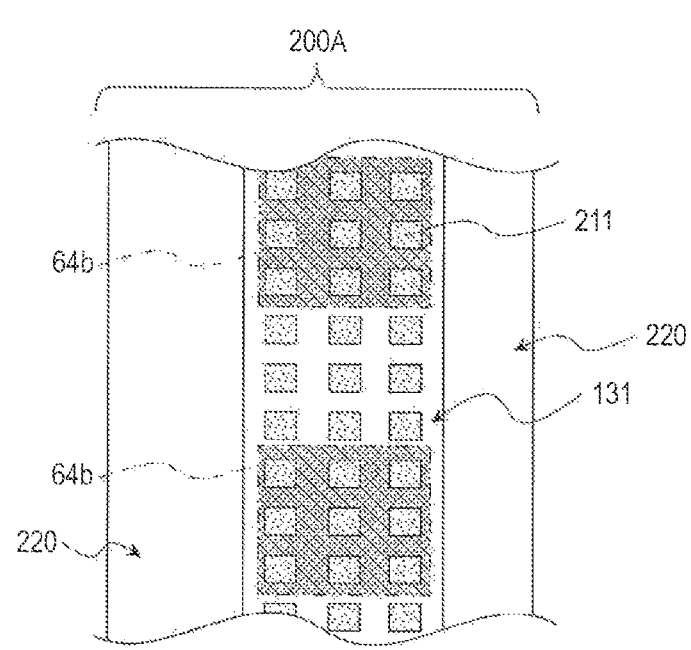
FIG. 5 is a schematic plan view showing another example appearance of the blockade region 200A as viewed from the normal direction of a semiconductor substrate 130, for describing an example arrangement of a p-type region(s) 64b.

FIG. 4 and FIG. 5 schematically show illustrative appearances of the blockade region 200A as viewed from the normal direction of the semiconductor substrate 130. In these examples, a plurality of contact plugs 211 are arranged in three rows along a doped region 131 that is formed in a belt shape on the semiconductor substrate 130.

As will be understood from FIG. 3, on the semiconductor substrate 130, the p-type region (s) 64b is located below the plurality of contact plugs 211 in the blockade region 200A. In the example shown in FIG. 4, the p-type region (s 64b is formed inside the semiconductor substrate 130, in a belt shape along the doped region 131 of the blockade region 200A. It will be appreciated that the shape and arrangement of the p-type region(s) 64b are not limited to this example; as illustrated in FIG. 5, they may be provided in a plurality of places below the plurality of contact plugs 211, inside the semiconductor substrate 130. Note that, inside the semiconductor substrate 130, the doped region 131 may extend to below the isolation 220 located between the imaging region R1 and the peripheral region R2.

FIG. 3 is referred to again. In the example shown in FIG. 3, the blockade region 200A further includes an re-type doped region 83n that is located near its boundary with the peripheral region R2. Within the impurity layer 62, the n-type doped region 83n is located above the n-type semiconductor layer 62bn and has an electrical connection with the n-type semiconductor layer 62bn. Contact plugs may be provided in the n-type doped region 83n. By connecting an appropriate power source to the contact plugs that are connected to the n-type doped region 83n, it is possible to control the potentials of the n-type doped region 83n and the n-type semiconductor layer 62bn.

Each of the impurity layer and the doped region located above the support substrate 140 is typically formed via ion implantation of impurities into a semiconductor layer that has been obtained through epitaxial growth on the support substrate 140. Note that, within the p-type region 64, the p-type regions 64a that are located in the imaging region R1 may be formed in a position not overlapping device isolations of the pixel in plan view.

In the present embodiment, between the imaging region R1 and the peripheral region R2, the blockade region 200A is formed. As described earlier, the blockade region 200A includes the isolation 220 located between the imaging region R1 and the peripheral region R2 and the doped region 131 in which the plurality of contact plugs 211 are disposed. Since the blockade region 200A at least includes the doped region 131, a so-called gettering effect can be obtained by utilizing the dopant within the doped region 131. For example, it is known that image quality may deteriorate if metal impurities diffuse into a region of the semiconductor substrate supporting the photoelectric conversion layer in which the pixels are disposed. By allowing the dopant within the doped region 131 to function as a gettering center, diffusion of metal impurities into the charge storage region can be suppressed, thereby avoiding degradation of image quality associated with metal impurity diffusion.

An example of a p-type dopant for the silicon substrate is boron; and examples of n-type dopants are phosphorus, arsenic, and antimony. Among these, p-type dopants are known to exhibit the gettering effect for most metals, and therefore are suitable as dopants for the doped region 131. In a typical embodiment of the present disclosure, the p-type is chosen as the conductivity type of the doped region 131 of the blockade region 200A. For example, by disposing the blockade region 200A, which includes the doped region 131 doped with a p-type impurity, between the imaging region R1 and the peripheral region R2, diffusion of metal impurities into the imaging region R1 can be effectively suppressed. In other words, by suppressing diffusion of metal impurities into the charge storage regions of the pixels 110, degradation of image quality associated with metal impurity diffusion can be suppressed. Achievement of the gettering effect by choosing the p-type impurity for the dopant of the doped region 131 will be particularly useful when a silicide layer is formed for contacts, etc., in the peripheral circuitry.

Figure 6:
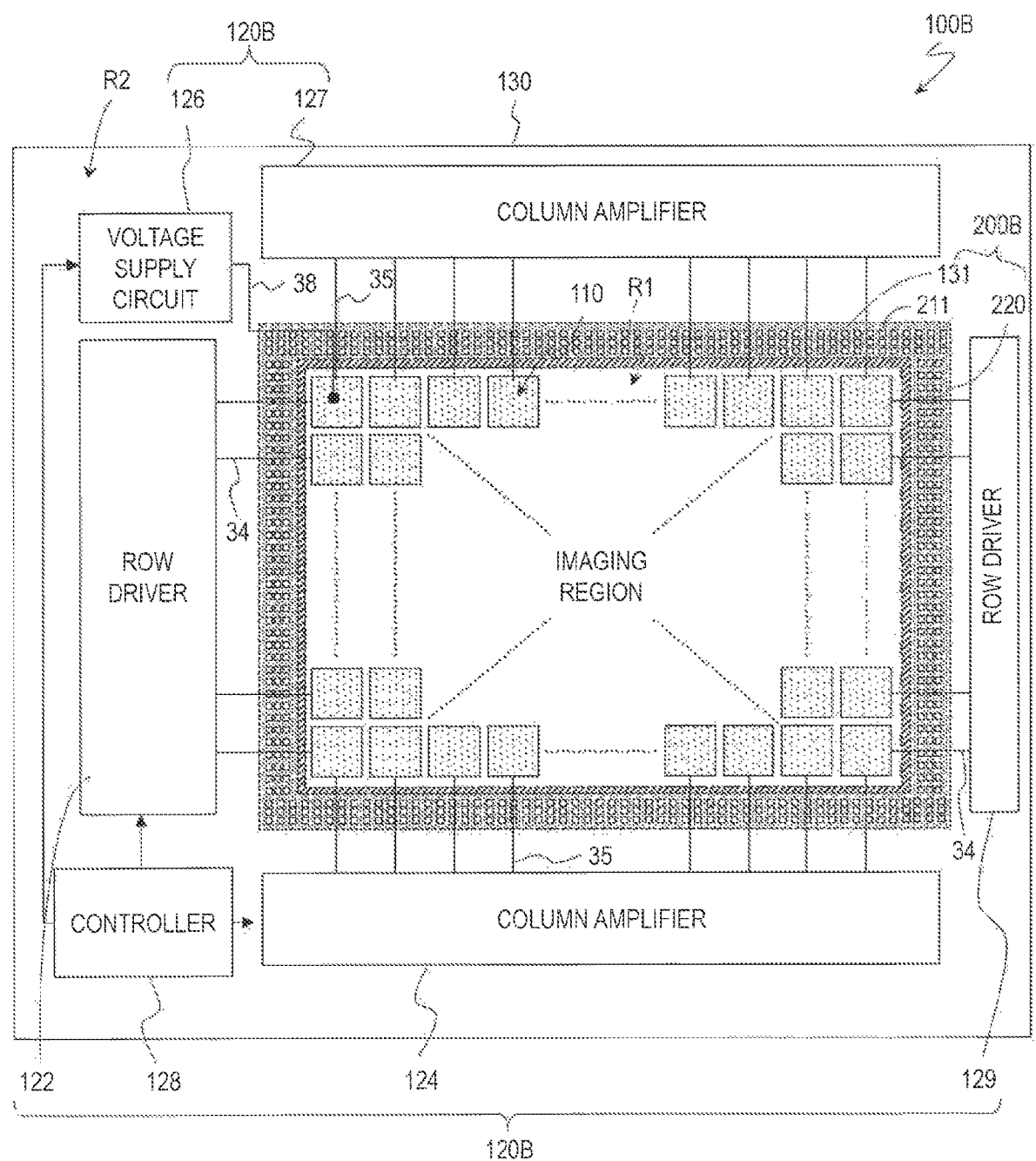
FIG. 6 is a schematic plan view showing another example shape of the blockade region.

FIG. 6 shows another example shape of the blockade region. As compared to the imaging device 100A shown in FIG. 1, instead of the blockade region 200A, the imaging device 100B shown in FIG. 6 includes a blockade region 200B which surrounds the imaging region R1 in a rectangular shape. As compared to the aforementioned blockade region 200A, the doped region 131 of the blockade region 200B uninterruptedly surrounds the imaging region R1 in an annular shape in plan view. As schematically shown in FIG. 6, in this example, too, a plurality of contact plugs 211 are connected to the doped region 131. In this example, inside the doped region 131, the isolation 220 in the blockade region 200B also uninterruptedly surrounds the imaging region R1 in an annular shape. In such a configuration, it can be said that the isolation 220 defines a boundary between the imaging region R1 and peripheral region R2.

Herein, the peripheral circuitry 120E provided in the peripheral region R2 includes not only the row driver 122, the column amplifier 124, the voltage supply circuit 126, and the controller 128, but also a second row driver 129 and a second column amplifier 127. The row driver 129 is disposed on the opposite side of the imaging region R1 to the row driver 122. As shown in the figure, address signal lines 34 provided correspondingly to the respective rows in the plurality of pixels 110 are connected also to the row driver 129. Similarly, the column amplifier 127 is disposed on the opposite side of the imaging region R1 to the column amplifier 124, and vertical signal lines 35 provided correspondingly to the respective columns in the plurality of pixels 110 are connected thereto.

For example, the row driver 122 is responsible for the row selection operation of the pixels in the left half of the imaging region R1, whereas the row driver 129 is responsible for the row selection operation of the pixels in the right half of the imaging region R1. Moreover, the column amplifier 124 is responsible for the processing of signals which are read from the pixels in the lower half of the imaging region R1, whereas the column amplifier 127 is responsible for the processing of signals which are read from the pixels in the upper half of the imaging region R1. Thus, by partitioning the imaging region R1 and performing signal read with the plurality of row drivers and the plurality of column amplifiers, a rapid operation can be attained, e.g., by shortening the frame rate.

In the configuration illustrated in FIG. 6, the row drivers 122 and 129 and the column amplifiers 124 and 127 are disposed along the four sides of the rectangular shape of the imaging region R1. In other words, in this example, the blockade region 200E is present between the row driver 122 and the aggregation of pixels 110, between the row driver 129 and the aggregation of pixels 110, between the column amplifier 124 and the aggregation of pixels 110, and between the column amplifier 127 and the aggregation of pixels 110.

By forming the blockade region 200B on the semiconductor substrate 130 in a shape that surrounds the imaging region R1 containing an array of multiple pixels 110 in plan view, a charge transfer between the charge storage regions of the pixels and any circuit formed in the peripheral region R2 can be suppressed more effectively. As in the example shown in FIG. 6, in the case where the circuits constituting the peripheral circuitry are disposed so as to surround the rectangular imaging region R1, for example, it is not a requirement in an embodiment of the present disclosure that the blockade region uninterruptedly surround the imaging region R1 in an annular shape in plan view. For example, the blockade region may include a plurality of portions each of which includes the isolation 220 and the doped region 131 and which as a whole are disposed so as to surround the imaging region R1. In such a configuration, too, similar effects can be expected as in the case of providing a blockade region so as to uninterruptedly surround the imaging region R1 in an annular shape in plan view.

Figure 7:
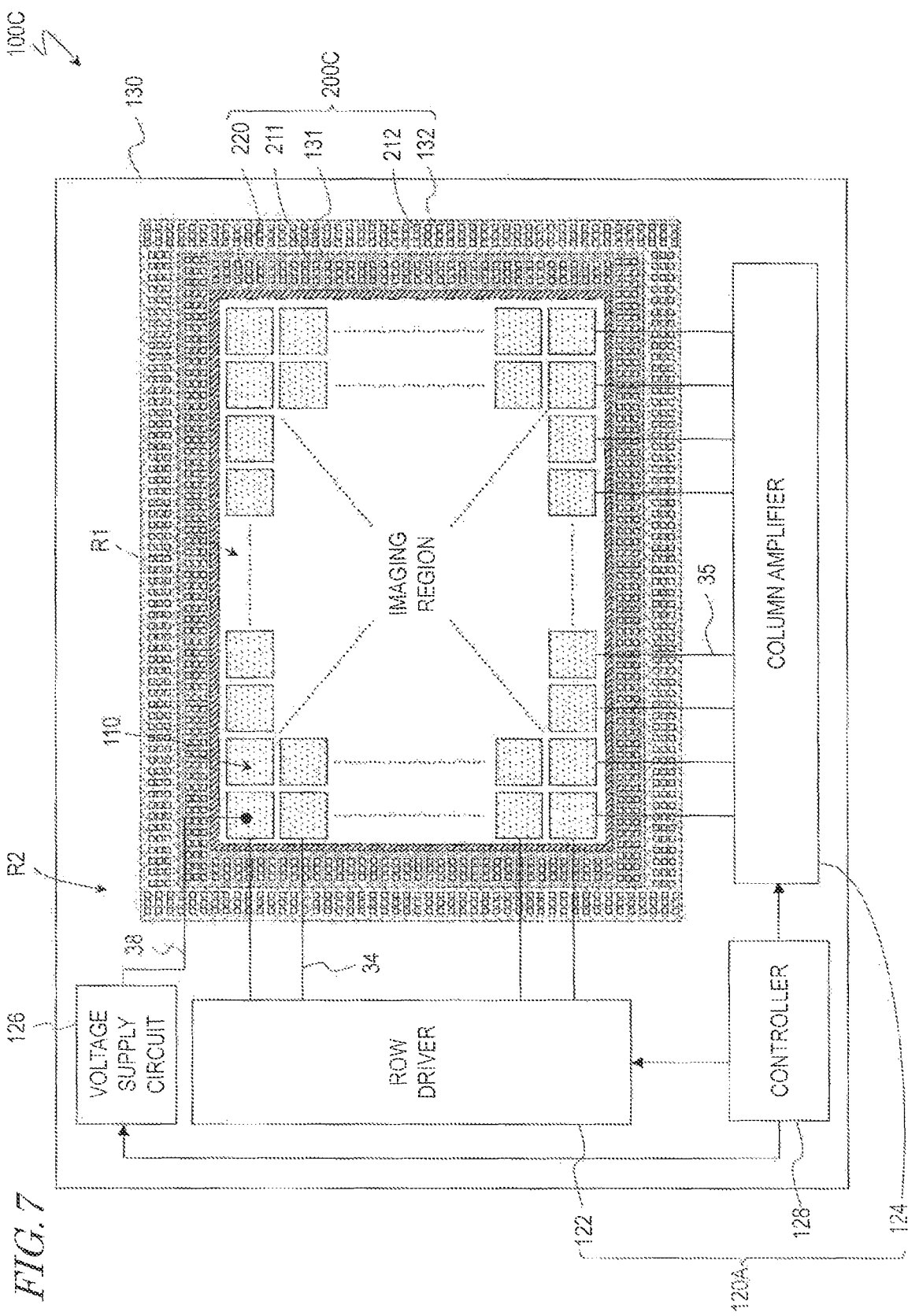
FIG. 7 is a diagram schematically showing an example configuration for an imaging device according to another embodiment of the present disclosure.

FIG. 7 schematically shows an example configuration of an imaging device according to another embodiment of the present disclosure. As compared to the imaging device 100 shown in FIG. 1, the imaging device 100C shown in FIG. 7 includes a blockade region 200C instead of the blockade region 200A. Similarly to the blockade region 200B which has been described with reference to FIG. 6, the blockade region 200C is also formed on the semiconductor substrate 130 so as to surround the imaging region R1. However, as schematically shown in FIG. 7, the blockade region 200C further includes a doped region 132 that is located outside of the doped region 131. In this example, the doped region 132 uninterruptedly surrounds the imaging region R1 in an annular shape in plan view.

The doped region 132 is located between the doped region 131 and the peripheral region R2, and has a conductivity type different from that of the doped region 131. Similarly to the doped region 131, the doped region 132 has a plurality of contact plugs 212 connected thereto. The plurality of contact plugs 212 are connected to a power source not shown, so that predetermined voltage is supplied thereto during the operation of the imaging device 100C. In other words, during the operation of the imaging device 100C, the potential of the doped region 132 is kept at a constant potential.

Figure 8:
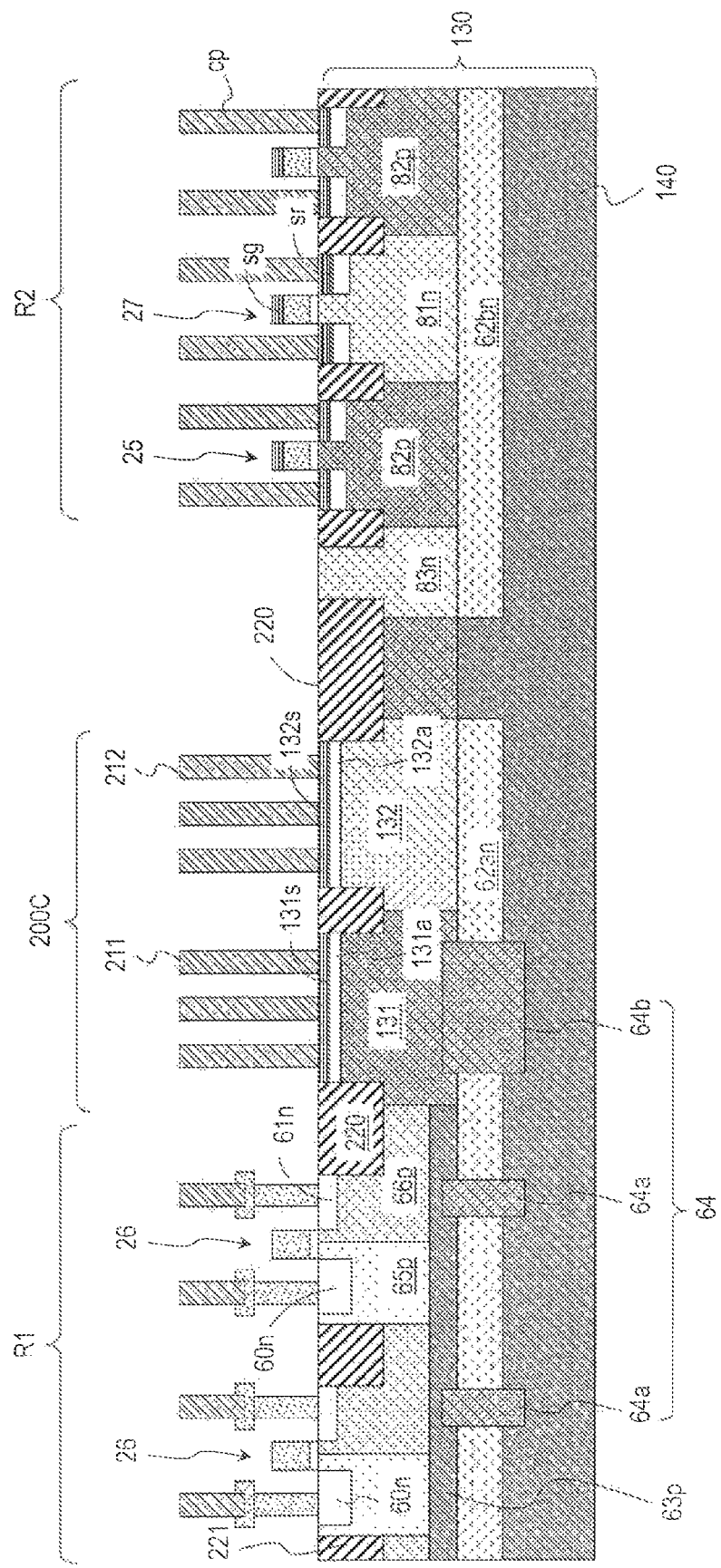
FIG. 8 is a schematic cross-sectional view related to an imaging device 100C shown in FIG. 7.

FIG. 8 schematically shows a cross section containing the imaging region R1 and peripheral region R2 and the blockade region 200C. In order to prevent the drawings from becoming overly complicated, the photoelectric conversion structure 10 and the interlayer insulating layer 90 above the semiconductor substrate 130 are omitted from illustration in FIG. 8. In any other subsequent drawing, too, the photoelectric conversion structure 10 and the interlayer insulating layer 90, etc., may be omitted from illustration.

As schematically shown in FIG. 8, the n-type doped region 132 (for example) of the blockade region 200C is located closer to the peripheral region R2 than is the p-type doped region 131 (for example), inside the semiconductor substrate 130. In the configuration illustrated in FIG. 8, the doped region 132 includes a doped region 132a whose impurity concentration is made comparatively high. Being connected to this doped region 132a allows the plurality of contact plugs 212 to have reduced contact resistance. In this example, within the doped region 132a, a silicide layer 132s is provided in the surface vicinity of the semiconductor substrate 130, thereby enabling further reduction in contact resistance.

Herein, the doped region 132 reaches an n-type semiconductor layer 62an located below the doped regions 60n at least partially composing the charge storage regions of the respective pixels. Such a configuration allows the doped region 132 and the n-type semiconductor layer 62an to be electrically connected to each other. Therefore, with voltage application to the plurality of contact plugs 212, it becomes possible to control the potential of the n-type semiconductor layer 62an via the doped region 132. In other words, this may allow the plurality of contact plugs 212 to function as well contacts. In the case where the doped region 132 is shaped so as to uninterruptedly surround the imaging region R1 in an annular shape in plan view, the p-type region(s) 64b extending through the n-type semiconductor layer 62an is to be formed inside the semiconductor substrate 130 in an island shape(s) in plan view, as in the example shown in FIG. 5.

Herein, the cross section depicted in FIG. 8 corresponds to the structure in a cross section in the neighborhood of e.g. the right end of the imaging region R1 shown in FIG. 7. In the configuration illustrated in FIG. 7, the neighborhood of the left end of the imaging region R1 has a generally similar cross-sectional structure to what would be obtained by reversing the right and left of the structure shown in FIG. 8. In other words, herein, in a cross section perpendicular to the surface of the semiconductor substrate 130, the doped region 132 of the blockade region 200C can be said to include two portions each extending from the surface of the semiconductor substrate 130 to the n-type semiconductor layer 62an. As in this example, inside the semiconductor substrate 130, the doped regions 60n of the plurality of pixels 110 may be surrounded by the doped region 132 beginning from the surface of the semiconductor substrate 130 and reaching the n-type semiconductor layer 62an, and by the n-type semiconductor layer 62an that is located in a position deeper than the doped region 60n within each pixel. With such a configuration, transfers of excess charge into the doped regions 60n functioning as the charge storage regions can be suppressed more effectively.

Figure 9:
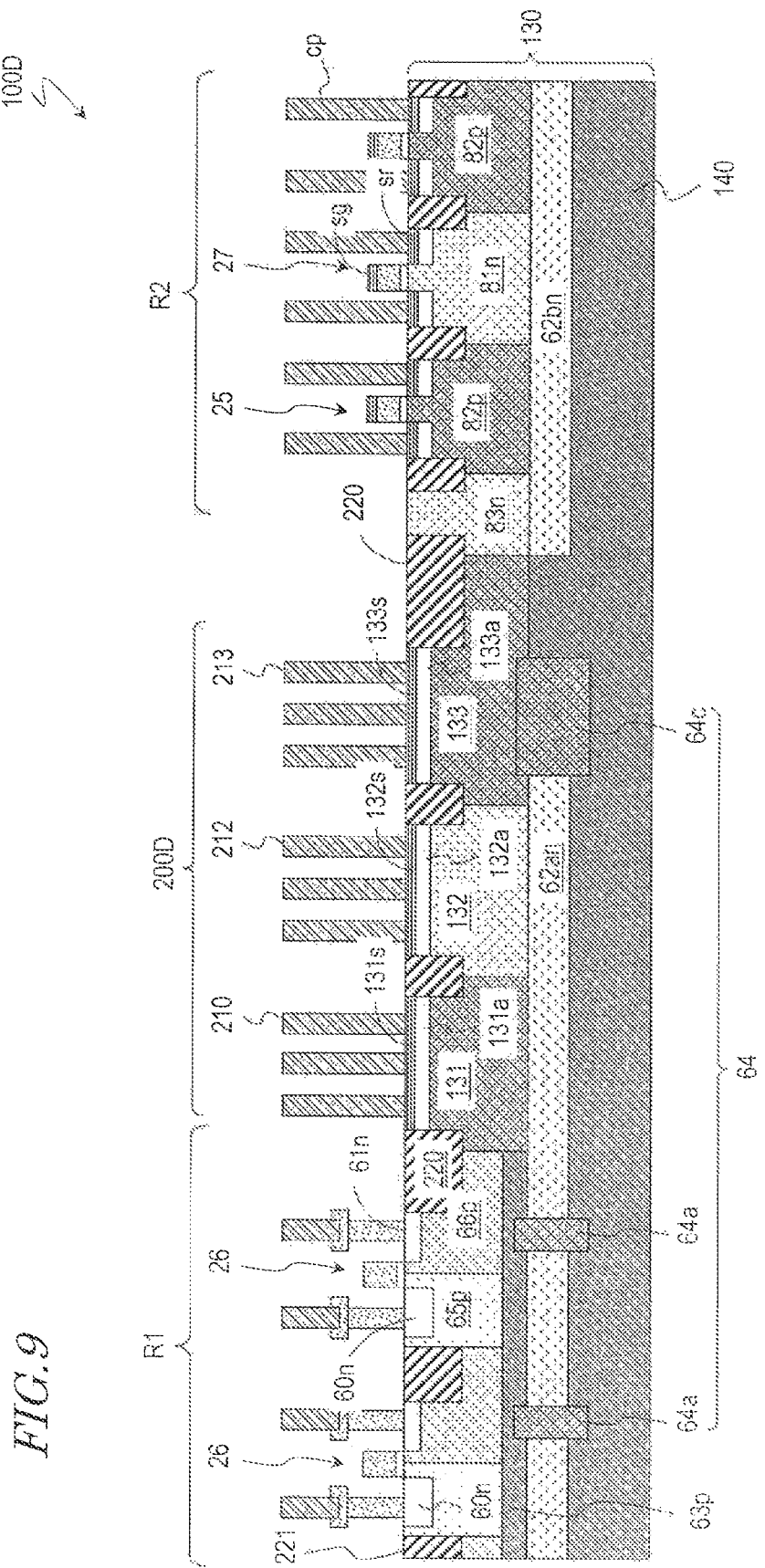
FIG. 9 is a schematic cross-sectional view related to an imaging device according to still another embodiment of the present disclosure.

FIG. 9 schematically shows a cross section of an imaging device according to still another embodiment of the present disclosure. As compared to the imaging device 100C described with reference to FIG. 7 and FIG. 8, the imaging device 100D shown in FIG. 9 includes a blockade region 200D, instead of the blockade region 200C.

As shown in FIG. 9, the blockade region 200D includes not only a doped region 131 including a doped region 131a inside which a silicide layer 131s is provided and a doped region 132 including a doped region 132a inside which a silicide layer 132s is provided, but also a doped region 133 of a first conductivity type including a doped region 133a inside which a silicide layer 133s is provided. The impurity concentration of the doped region 133a is higher than that of the doped region 133. The silicide layer 133s is located in the surface vicinity of the semiconductor substrate 130, and a plurality of contact plugs 213 are connected thereto.

Similarly to the plurality of contact plugs 211, a power source to supply a predetermined voltage is connected to the plurality of contact plugs 213. With a predetermined voltage being supplied via the plurality of contact plugs 213, during the operation of the imaging device 100D, the potential of the doped region 133 is controlled to a constant potential. In this example, the p-type region 64 includes a p-type region 64c which is formed inside the semiconductor substrate 130 so that its one end reaches the doped region 133. As shown in the figure, the other end of the p-type region 64c reaches the support substrate 140. Therefore, through control of the voltage applied to the plurality of contact plugs 213, it is possible to control the potentials of the wells located around the plurality of doped regions 60n located in the imaging region R1, via an electrical path that is created by the p-type region 64c, the support substrate 140, and the plurality of p-type regions 64a located in the imaging region R1. As compared to the example shown in FIG. 8 and the like, a p-type region(s) 64b to be located below the doped region 131 is omitted in this example; however, instead of the p-type region 64c, or in addition to the p-type region 64c, a p-type region (s) 64b may be disposed in the semiconductor substrate 130.

As shown in FIG. 9, within the blockade region 200D, the doped region 133 is located between the doped region 132 of a second conductivity type and the peripheral region R2. In plan view, the doped region 133 is shaped so as to uninterruptedly surround. e.g. the imaging region R1 in an annular shape, as is the doped region 132 shown in FIG. 8. Further disposing the doped region 133 of the first conductivity type outside the doped region 132 of the second conductivity type and inside the peripheral region R2 allows to more effectively restrain electrical coupling from occurring between the readout circuits 20 formed in the imaging region R1 and the peripheral circuitry 120 via the semiconductor substrate 130.

Figure 10:
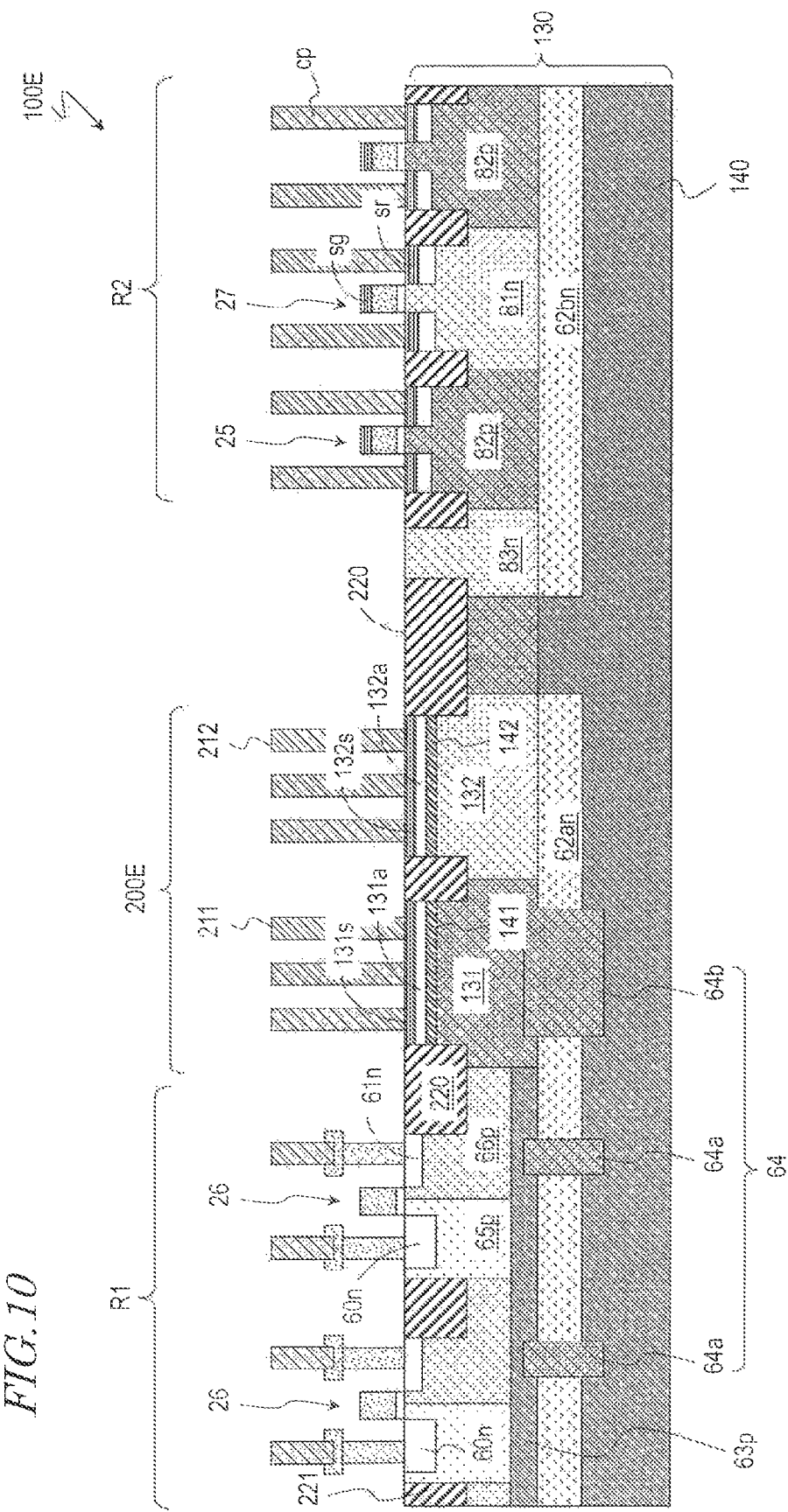
FIG. 10 is a schematic cross-sectional view showing a variant of an imaging device according to an embodiment of the present disclosure.

FIG. 10 shows a variant of an imaging device according to an embodiment of the present disclosure. The imaging device 100E shown in FIG. 10 includes a blockade region 200E. As does the blockade region 200C shown in FIG. 8, the blockade region 200E includes a doped region 131 of a first conductivity type and a doped region 132 of a second conductivity type that is located outside of the doped region 131. As compared to the configuration illustrated in FIG. 9, the configuration lacking the doped region 133 of the first conductivity type is more advantageous from the standpoint of reducing the footprint of the chip having the imaging region R1 formed thereon; thus, as in this example, it may do well to adopt the configuration from which doped region 133 of the first conductivity type is omitted.

In this example, the blockade region 200E includes a carbon-containing layer 141 that is located between a plurality of contact plugs 211 and the doped region 131. In this example, a carbon-containing layer 142 is formed also below the plurality of contact plugs 212. The carbon-containing layer 142 is located between the plurality of contact plugs 212 and the doped region 132. The carbon-containing layer 141 and the carbon-containing layer 142 can be formed, respectively before formation of the silicide layer 131$s$ and the silicide layer 132$s$, on the semiconductor substrate 130 by an ion implantation technique or the like.

As is well known, a silicide layer is typically a layer that is made of a compound resulting from silicon reacting with a metal, such as titanium, cobalt, nickel, platinum, or tungsten. In recent years, nickel has often been adopted as a metal for forming a silicide that exhibits lower resistivity. However, it is known that the heating during various heat treatment steps and film formation steps in a semiconductor process may allow metals in the silicide to diffuse into the semiconductor substrate. In particular, nickel within a silicide may easily diffuse into the semiconductor substrate in a step that involves a heat treatment. When nickel that has diffused into the semiconductor substrate arrives at the imaging region, crystal defects will be induced, whereby a defect level may occur in the silicon bandgap. A defect level in the silicon bandgap may cause leakage via the defect level. In other words, dark current may decrease the SN ratio, thus degrading the image quality.

As mentioned above, the p-type dopant in the doped region exhibits the gettering effect for most metals. Therefore, by choosing a p-type dopant as the dopant for forming the doped region 131, and forming the doped region 131 on the semiconductor substrate 130 so as to surround the imaging region R1, diffusion of a metal impurity from the silicide layers 131$s$ and 132$s$ disposed in the blockade region 200E and/or the silicide layer sr disposed in the peripheral region R2 into the imaging region R1 can be suppressed. However, according to a study by the inventors, the gettering effect based on the dopant may not be sufficient for ions of heavy metals such as nickel ions.

On the other hand, in the configuration illustrated in FIG. 10, the carbon-containing layers 141 and 142 are formed below the silicide layer 131$s$ and 132$s$. In other words, in the example shown in FIG. 10, the silicide layer 131$s$ is located between the plurality of contact plugs 211 and the carbon-containing layer 141. Similarly, the silicide layer 132$s$ is located between the plurality of contact plugs 212 and the carbon-containing layer 142. Disposing the carbon-containing layer below the silicide layer formed in the blockade region makes it possible to suppress diffusion of nickel from the silicide layer in the blockade region into the imaging region R1, through gettering of nickel ions with carbon. This also provides an effect of suppressing diffusion of nickel from the silicide layer formed in the peripheral region R2 into the imaging region R1, whereby degradation of image quality due to diffusion of nickel ions can be effectively avoided.

Furthermore, the inventors have found that nickel which has diffused from the silicide layer tends to segregate near the boundary between the carbon-containing layer and the surrounding doped region. In the configuration illustrated in FIG. 10, the isolation 220 of the blockade region 200E includes a portion that is located between the imaging region R1 and the doped region 131 connected to the plurality of contact plugs 211 in plan view. Furthermore, in this example, the carbon-containing layer 141 and the carbon-containing layer 142 are not formed, at least, in any portion that is located in a position deeper than the portion of the isolation 220 that is located between the imaging region R1 and the plurality of contact plugs 211. In other words, in a typical embodiment of the present disclosure, a peak of carbon concentration along the depth direction of the semiconductor substrate 130 in e.g. the carbon-containing layer 141 is at a position shallower than a lower end of the isolation 220. Ensuring that a peak in carbon concentration along the normal direction of the semiconductor substrate 130 is at a position shallower than a lower end of the isolation 220 of the blockade region can minimize the range over which nickel is diffused from the silicide layer disposed in the blockade region.

Figure 11:
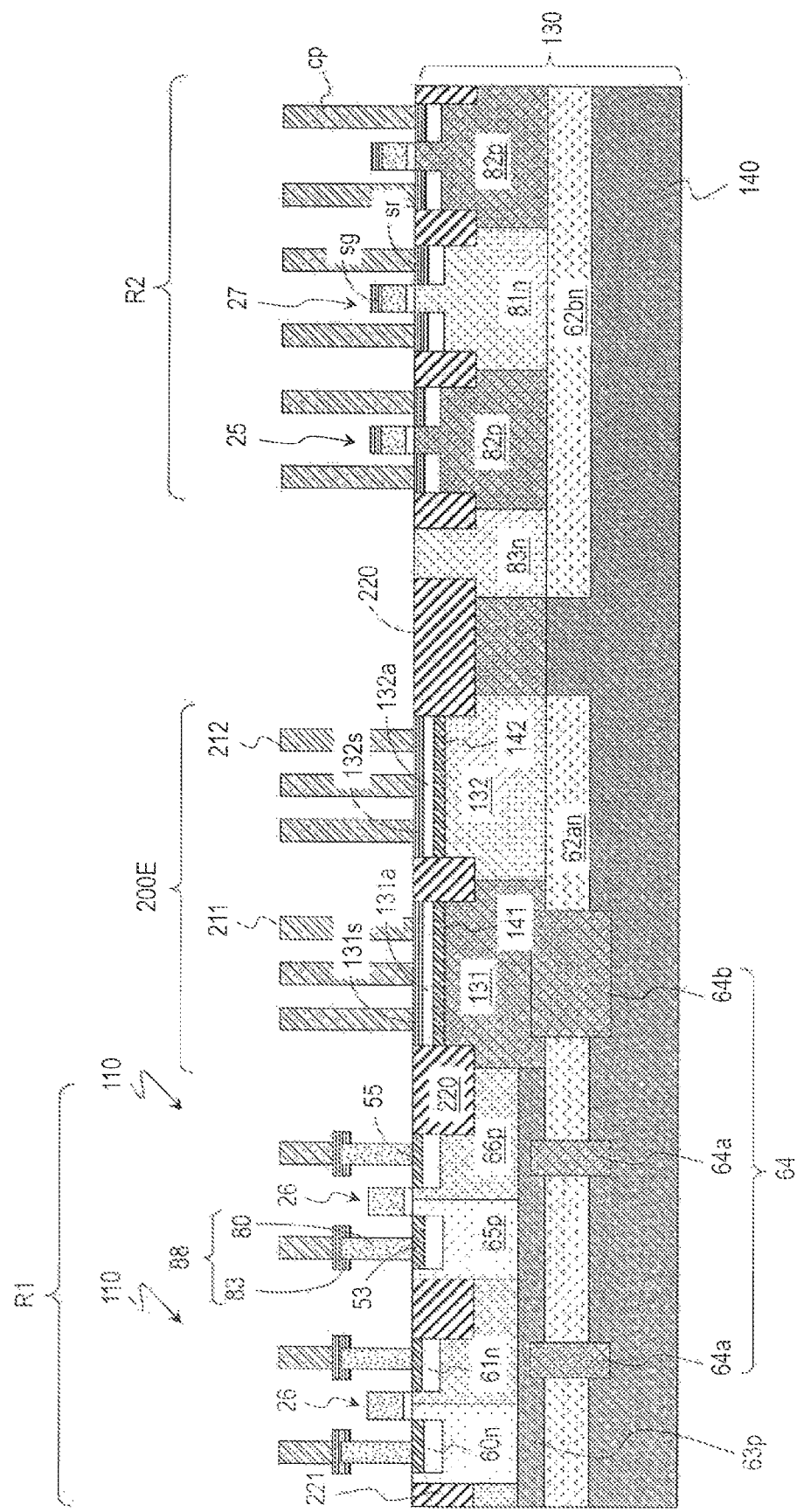
FIG. 11 is a schematic cross-sectional view showing another variant of an imaging device according to an embodiment of the present disclosure.

FIG. 11 shows another variant of an imaging device according to an embodiment of the present disclosure. In the configuration illustrated in FIG. 11, each pixel disposed in the imaging region R1 includes an electrically conductive portion 88, which includes a contact plug 80 connected to the doped region 60$n$ in a portion thereof. The electrically conductive portion 88 is a portion of the aforementioned electrically conducting structure 89. Therefore, the pixel electrode 11 of each photoelectric conversion structure 10 is electrically connected to a doped region 60$n$ via the electrically conductive portion 88. Herein, the electrically conductive portion 88 includes a contact plug 80 and a contact pad portion 83 connected to the other end of the contact plug 80. As described above, the contact plugs 80 are plugs made of polysilicon, and the contact pad portions 83 are also typically made of polysilicon.

In the configuration illustrated in FIG. 11, the contact pad portion 83 of each electrically conductive portion 88 includes a silicide layer at least in a portion thereof. The plug that is connected at an upper face side of the contact pad portion 83 is typically made of a metal such as copper. Providing a silicide layer on e.g. the upper face of the contact pad portion 83 allows to reduce the connection resistance between the plug that is connected at the upper face side of the contact pad portion 83 and the contact pad portion 83. In this example, a silicide layer is formed also in a contact pad portion of an electrically conductive portion that is connected to a doped region 61$n$.

Furthermore, in the configuration illustrated in FIG. 11, a carbon-containing layer 53 is formed in the surface vicinity of the semiconductor substrate 130 where each contact plug 80 is connected. As, in this example, presence of the carbon-containing layer 53 between the contact plug 80 and the doped region 60n allows diffusion of nickel or the like into the doped region 60n via the contact plug 80 to be suppressed by the carbon-containing layer 53, even in the case where the electrically conductive portion includes a silicide in a portion thereof. Herein, carbon-containing layer 55 is similarly disposed also above each doped region 61n of the semiconductor substrate 130, whereby diffusion of nickel or the like into the doped region 61n is suppressed, which in turn allows degradation of image quality due to nickel diffusion into the doped region 61n to be suppressed.

Similarly to the above-described carbon-containing layer 141 and the like, the carbon-containing layer 53 and the carbon-containing layer 55 can be formed by ion implantation technique. Alternatively, in a plasma etching step for providing contact holes in the insulating layer(s) covering the surface of the semiconductor substrate 130, a gas containing carbon may be used as an etching gas to form such carbon-containing layers concurrently with the contact hole formation. In this case, the concentration of carbon in the carbon-containing layers may show a lower value than that in a carbon-containing layer that is formed by ion implantation technique.

Figure 12:
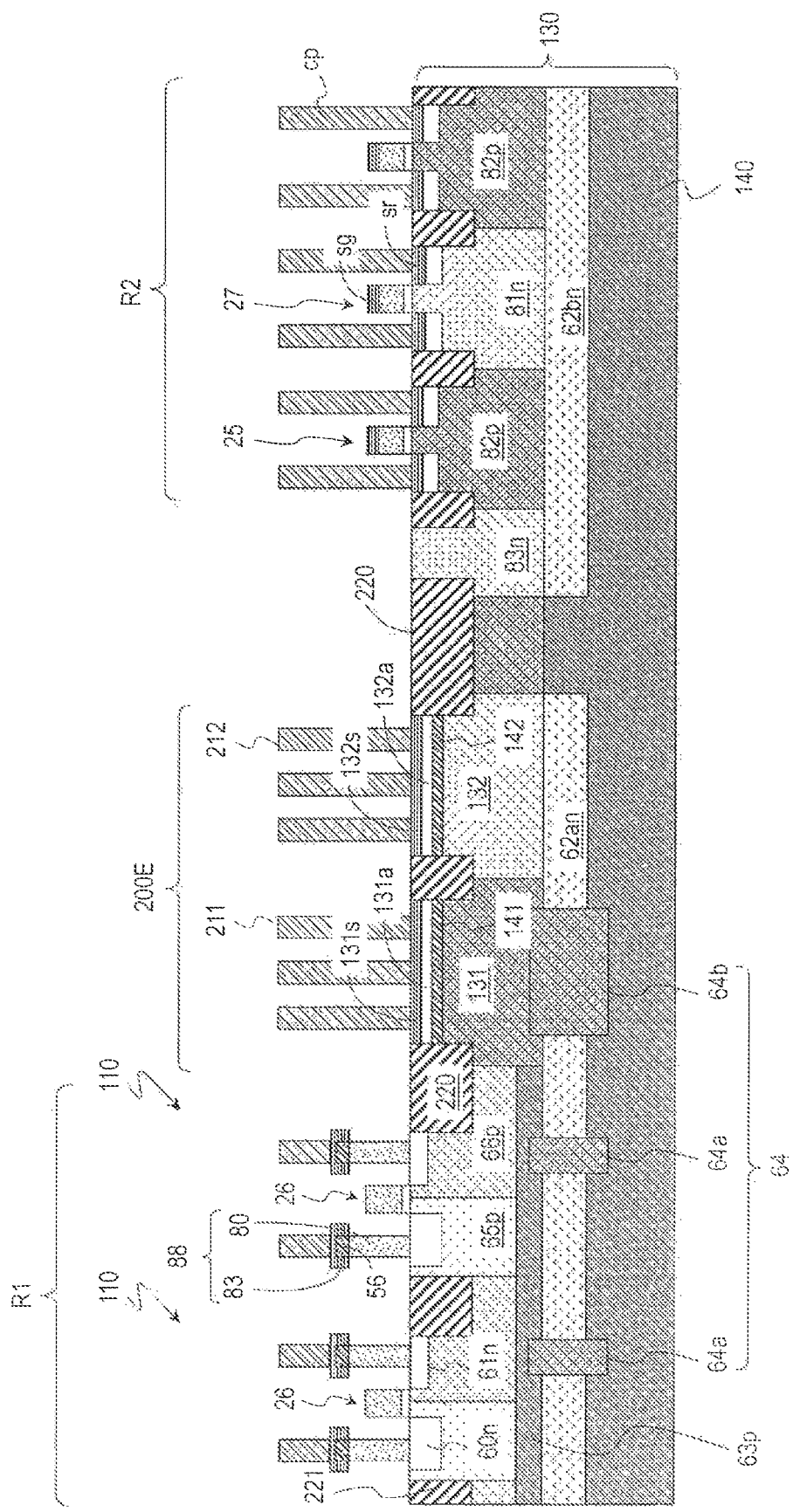
FIG. 12 is a schematic cross-sectional view showing still another variant of an imaging device according to an embodiment of the present disclosure.

Note that, without being limited to near the surface of the semiconductor substrate 130, a carbon-containing layer may be disposed between a silicide layer formed in electrically conductive portions 88 and e.g. an doped region 60n formed on the semiconductor substrate 130, whereby similar effects of preventing nickel diffusion can be obtained. FIG. 12 shows still another variant of an imaging device according to an embodiment of the present disclosure. In the example shown in FIG. 12, a carbon-containing layer 56 is formed at a lower face side of a contact pad portion 83 which has a silicide layer provided at e.g. its upper face side.

With such a configuration, too, diffusion of nickel or the like from the silicide layer formed in the contact pad portion 83 can be suppressed by the carbon-containing layer 56 located below the silicide layer. Therefore, diffusion of nickel into e.g. the doped region 60n can be suppressed, whereby degradation of image quality can be prevented. The carbon-containing layer 56 can be formed at a position of the electrically conductive portion 88 that lies between the silicide layer and the semiconductor substrate 130, by e.g. ion implantation technique. For example, a carbon-containing layer may be formed inside each contact plug 80.

As described above, according to an embodiment of the present disclosure, an imaging device is provided in which a decrease in the SN ratio associated with a dark current is suppressed. Note that the conductivity types of the doped regions in the semiconductor substrate 130 are not limited to the arrangement shown in each example above, and configurations in which the n-type and the p-type are reversed would also be possible. Moreover, the respective transistors, such as the aforementioned signal detection transistor 22, address transistor 24, reset transistor 26, etc., may be N-channel MOSFETs or P-channel MQSFETs. It is not necessary for all of these transistors to be uniformly N-channel MOSFETs or P-channel MOSFETs. In the case where each transistor in the pixel is chosen to be an N-channel MOSFET, and electrons are used as signal charges, the source and the drain in each such transistor may be reversed in position.

According to an embodiment of the present disclosure, an imaging device is provided which permits imaging with a high image quality while suppressing influences of dark currents. An imaging device according to the present disclosure is useful for image sensors, digital cameras, etc., for example. An imaging device according to the present disclosure can be used in medical cameras, cameras for use with robots, security cameras, cameras for onboard use in a vehicle, and the like.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. An imaging device comprising:
an imaging region including a plurality of pixels, each pixel including a photoelectric conversion layer, a pixel electrode to collect a charge generated in the photoelectric conversion layer, and a first doped region electrically connected to the pixel electrode;
a peripheral region located outside of the imaging region, with a circuit to drive the plurality of pixels being provided in the peripheral region;
a blockade region including: a second doped region of a first conductivity type located between the imaging region and the peripheral region; and a plurality of first contact plugs connected to the second doped region; a third doped region of a second conductivity type located between the peripheral region and the second doped region; and a plurality of second contact plugs provided in the third doped region, and
a semiconductor substrate having the first doped regions, the second doped region, and the third doped region, wherein
the semiconductor substrate further includes, inside the semiconductor substrate, an impurity layer of the second conductivity type that is located in a position deeper than the first doped regions; and
the third doped region includes two portions each extending, in a cross section perpendicular to a surface of the semiconductor substrate, from the surface and reaching the impurity layer.

2. The imaging device of claim 1, wherein the third doped region surrounds the imaging region in an annular shape in plan view.

3. The imaging device of claim 2, wherein, the blockade region includes:
a fourth doped region of the first conductivity type located between the peripheral region and the third doped region; and
a plurality of third contact plugs provided in the fourth doped region.

4. The imaging device of claim 1, wherein, the blockade region includes:
a fourth doped region of the first conductivity type located between the peripheral region and the third doped region; and
a plurality of third contact plugs provided in the fourth doped region.

5. The imaging device of claim 1, wherein the semiconductor substrate further includes a plurality of fourth doped regions of the first conductivity type extending through the impurity layer.

6. The imaging device of claim 5, wherein the plurality of fourth doped regions include one or more doped regions located below the plurality of first contact plugs, the one or more doped regions being connected at one end to the second doped region.

7. The imaging device of claim 1, wherein the blockade region includes a first carbon-containing layer that contains carbon, the first carbon-containing layer being located below the plurality of first contact plugs.

8. The imaging device of claim 5, wherein the blockade region includes an isolation located between the imaging region and the plurality of first contact plugs in plan view.

9. The imaging device of claim 8, wherein a peak in carbon concentration along a depth direction of the semiconductor substrate in the first carbon-containing layer appears at a position shallower than a lower end of the isolation.

10. The imaging device of claim 7, wherein the blockade region includes a first silicide layer located between the plurality of first contact plugs and the first carbon-containing layer.

11. The imaging device of claim 10, wherein the first silicide layer comprises nickel.

12. The imaging device of claim 1, wherein the second doped region surrounds the imaging region in an annular shape in plan view.

13. The imaging device of claim 1, wherein the first conductivity type is P-type.

14. The imaging device of claim 1, wherein,
each pixel includes an electrically conductive portion that includes in a portion thereof a third contact plug electrically connected to the first doped region;
the electrically conductive portion includes a first silicide layer; and
the pixel electrode is electrically connected to the first doped region via the electrically conductive portion.

15. The imaging device of claim 14, wherein the electrically conductive portion includes a first carbon-containing layer located between the first silicide layer and the first doped region.

16. The imaging device of claim 14, wherein the semiconductor substrate in each pixel includes a second carbon-containing layer located below the third contact plug.

17. An imaging device having a plurality of pixels, the imaging device comprising:
a semiconductor substrate in which a plurality of doped regions are provided, the semiconductor substrate being either a silicon substrate or a silicon-on-insulator substrate;
a photoelectric conversion layer supported by the semiconductor substrate; and
a plurality of pixel electrodes located between the semiconductor substrate and the photoelectric conversion layer, wherein,
each pixel includes:
a portion of the photoelectric conversion layer;
one of the plurality of pixel electrodes;
one of the plurality of doped regions; and
a contact plug electrically connected to the one of the plurality of doped regions; and
the semiconductor substrate includes a carbon-containing layer that contains carbon, the carbon-containing layer being located between the doped regions and the contact plugs.

18. The imaging device of claim 17, wherein the pixel electrode of each pixel is electrically connected to the doped region via the contact plug.

19. The imaging device of claim 17, wherein
the blockade region includes an isolation located between the imaging region and the plurality of first contact plugs in plan view, and
a peak in carbon concentration along a depth direction of the semiconductor substrate in the carbon-containing layer appears at a position shallower than a lower end of the isolation.

20. An imaging device comprising:
a semiconductor substrate which is either a silicon substrate or a silicon-on-insulator substrate,
an imaging region including a plurality of pixels, each pixel including a photoelectric conversion layer, a pixel electrode to collect a charge generated in the photoelectric conversion layer, and a first doped region provided in the semiconductor substrate, the first doped region electrically connected to the pixel electrode;
a peripheral region located outside of the imaging region, with a circuit to drive the plurality of pixels being provided in the peripheral region,
a blockade region including: a second doped region provided in the semiconductor substrate, the second doped region of a first conductivity type located between the imaging region and the peripheral region; and a plurality of first contact plugs connected to the second doped region, wherein
the blockade region includes a carbon-containing layer that contains carbon, the carbon-containing layer being located below the plurality of first contact plugs.

* * * * *